(12) United States Patent
Chang et al.

(10) Patent No.: US 12,315,726 B2
(45) Date of Patent: *May 27, 2025

(54) SEMICONDUCTOR DEVICE AND METHOD

(71) Applicant: Taiwan Semiconductor Manufacturing Co., Ltd., Hsinchu (TW)

(72) Inventors: Ching-Yu Chang, Taipei (TW); Jung-Hau Shiu, New Taipei (TW); Jen Hung Wang, Hsinchu (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/595,554

(22) Filed: Mar. 5, 2024

(65) Prior Publication Data

US 2024/0249942 A1 Jul. 25, 2024

Related U.S. Application Data

(63) Continuation of application No. 17/377,813, filed on Jul. 16, 2021, now Pat. No. 11,948,798, which is a continuation of application No. 16/583,949, filed on Sep. 26, 2019, now Pat. No. 11,069,528.

(60) Provisional application No. 62/753,184, filed on Oct. 31, 2018.

(51) Int. Cl.
*H01L 21/033* (2006.01)
*H01L 21/02* (2006.01)
*H01L 21/311* (2006.01)
*H01L 21/3213* (2006.01)

(52) U.S. Cl.
CPC .... *H01L 21/0331* (2013.01); *H01L 21/02167* (2013.01); *H01L 21/02211* (2013.01); *H01L 21/02214* (2013.01); *H01L 21/0228* (2013.01); *H01L 21/0337* (2013.01); *H01L 21/31144* (2013.01); *H01L 21/32133* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 8,431,329 | B2 | 4/2013 | Bae et al. |
| 10,304,744 | B1 | 5/2019 | Joseph et al. |
| 2014/0106574 | A1 | 4/2014 | Kang et al. |
| 2015/0108619 | A1 | 4/2015 | Nemani |
| 2018/0138040 | A1 | 5/2018 | LaVoie |

*Primary Examiner* — Stephanie P Duclair
(74) *Attorney, Agent, or Firm* — Slater Matsil, LLP

(57) ABSTRACT

A method for manufacturing an integrated circuit includes patterning a plurality of photomask layers over a substrate, partially backfilling the patterned plurality of photomask layers with a first material using atomic layer deposition, completely backfilling the patterned plurality of photomask layers with a second material using atomic layer deposition, removing the plurality of photomask layers to form a masking structure comprising at least one of the first and second materials, and transferring a pattern formed by the masking structure to the substrate and removing the masking structure. The first material includes a silicon dioxide, silicon carbide, or carbon material, and the second material includes a metal oxide or metal nitride material.

20 Claims, 21 Drawing Sheets

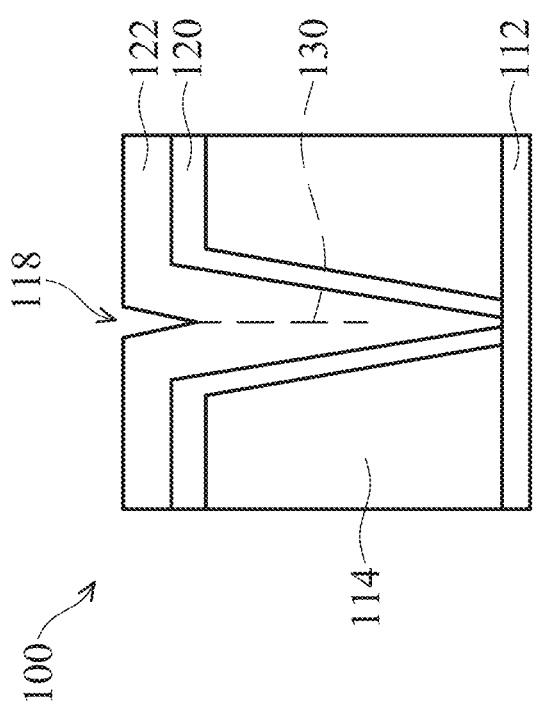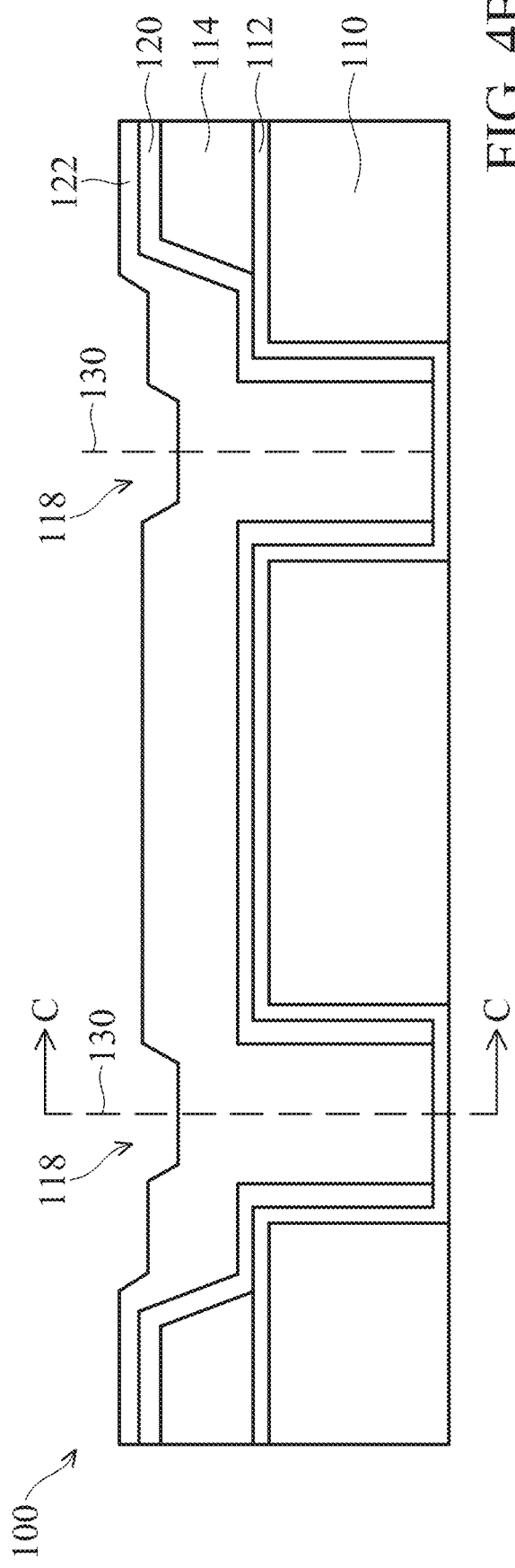

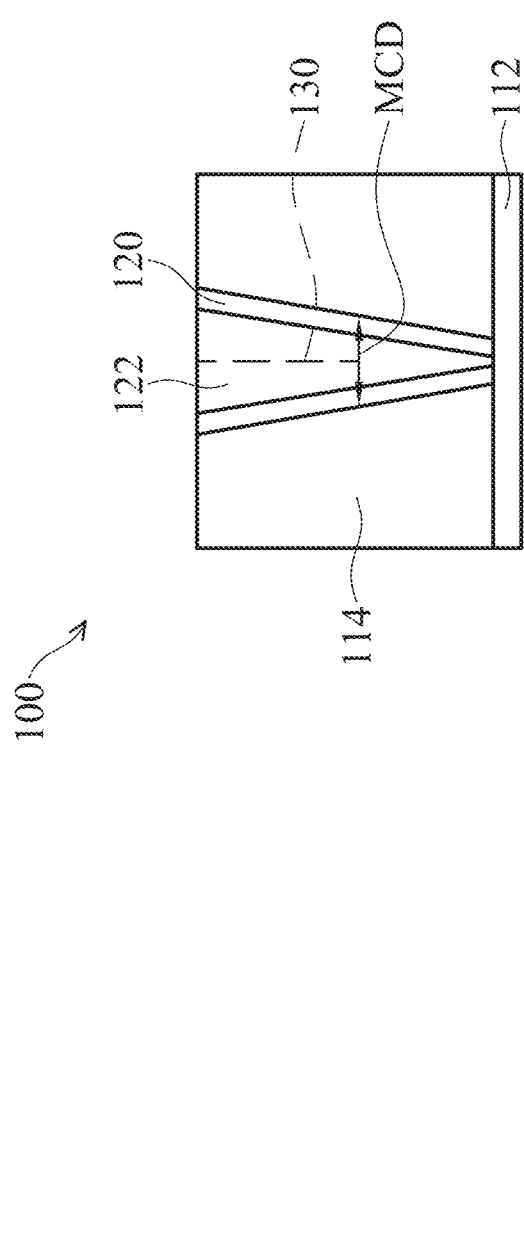
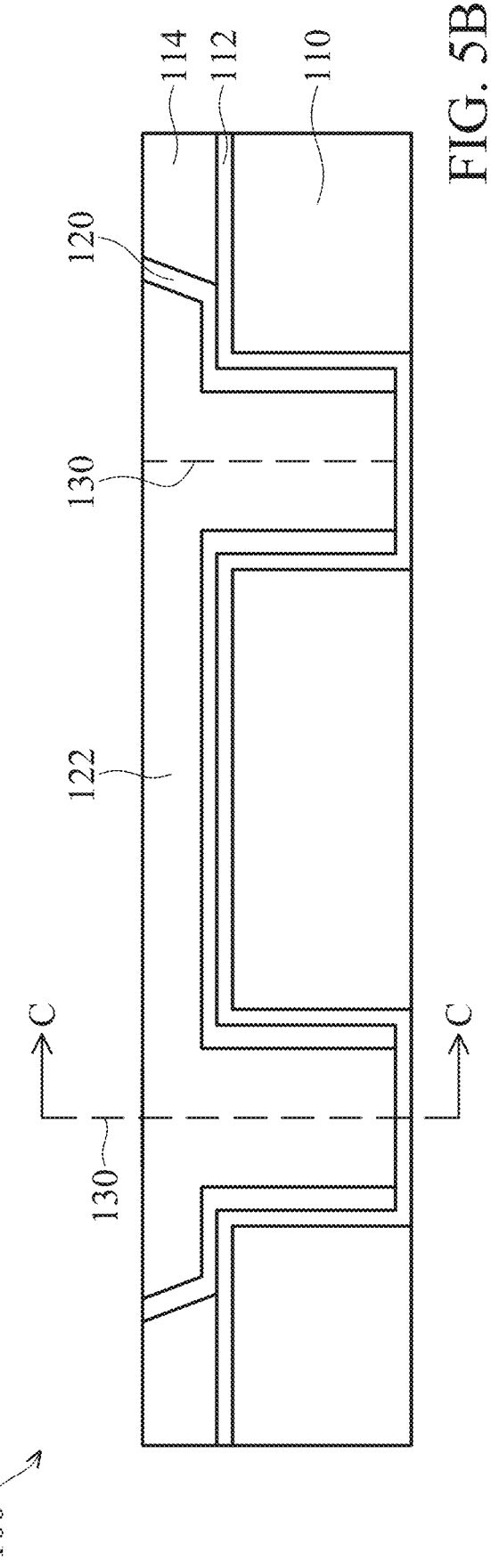

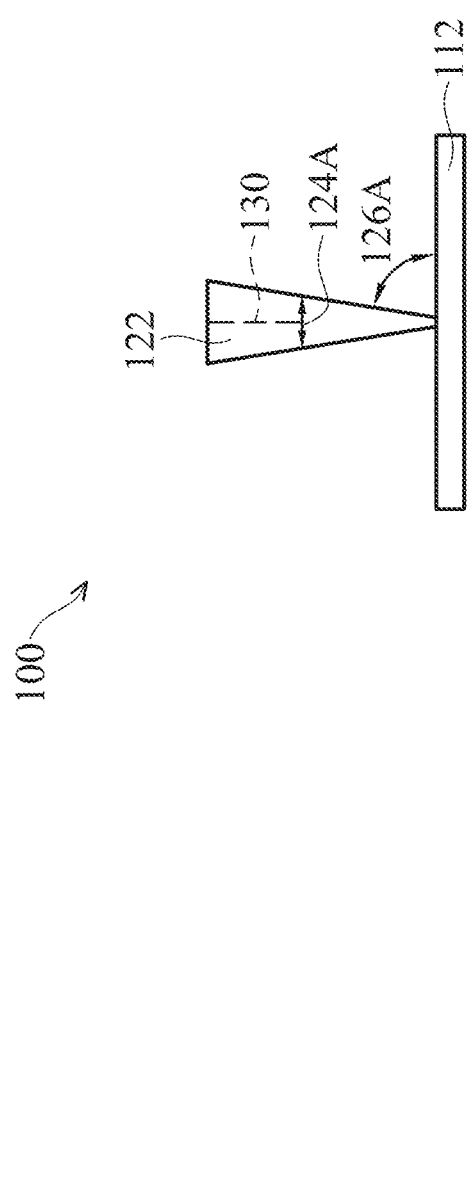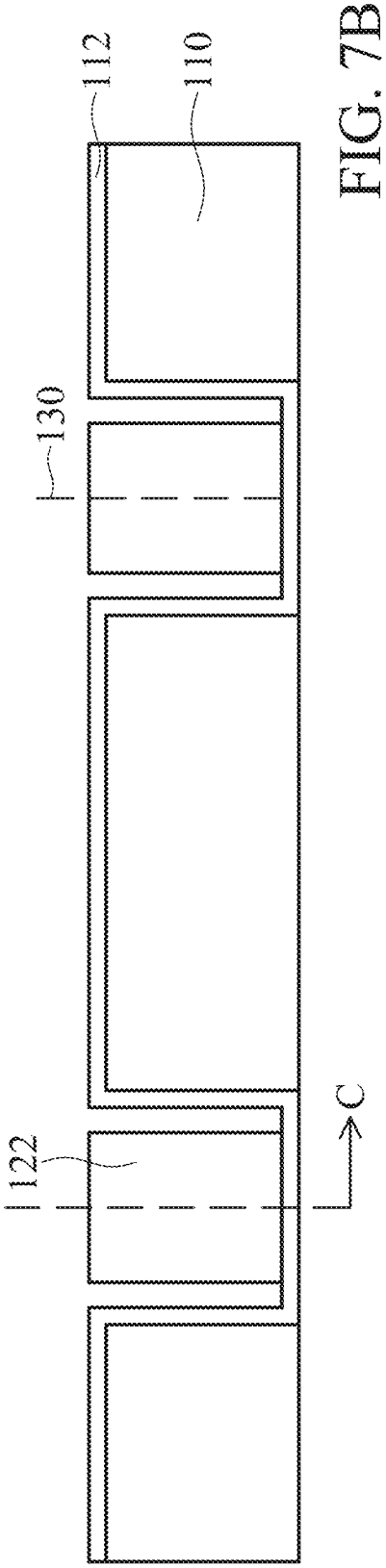

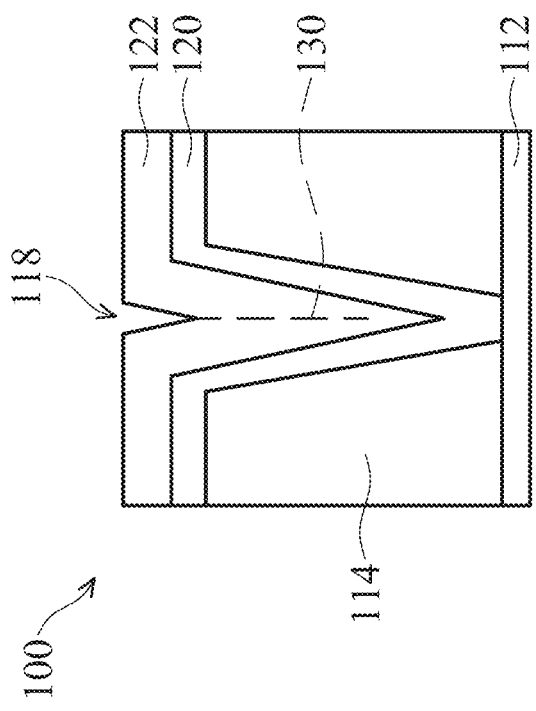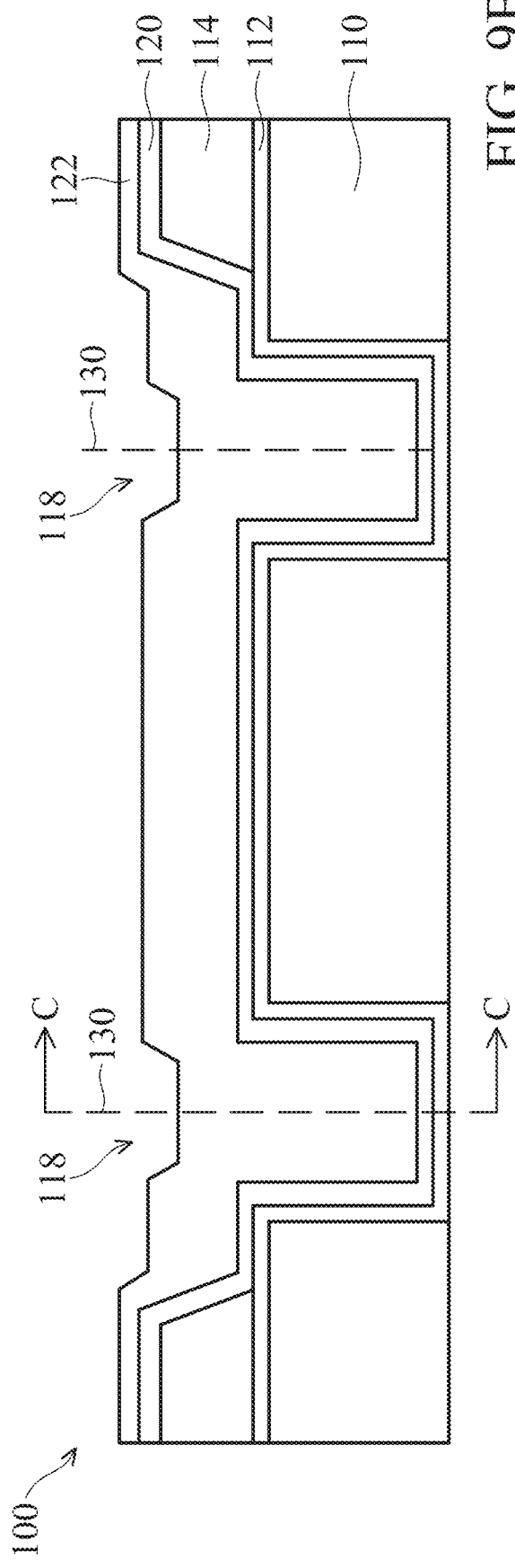

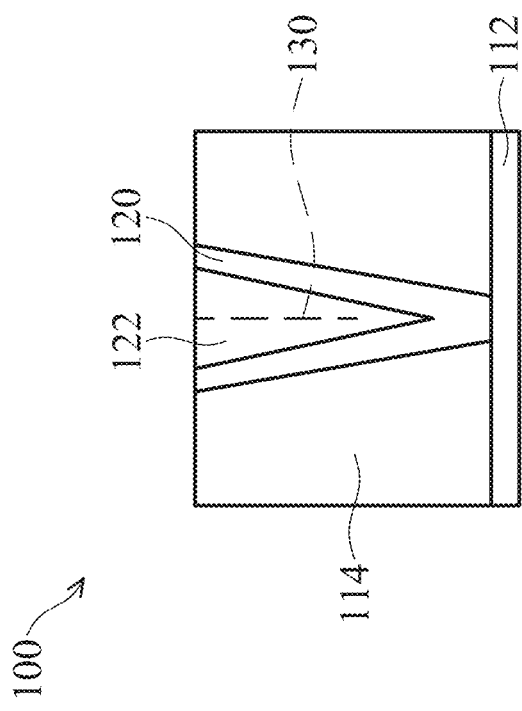
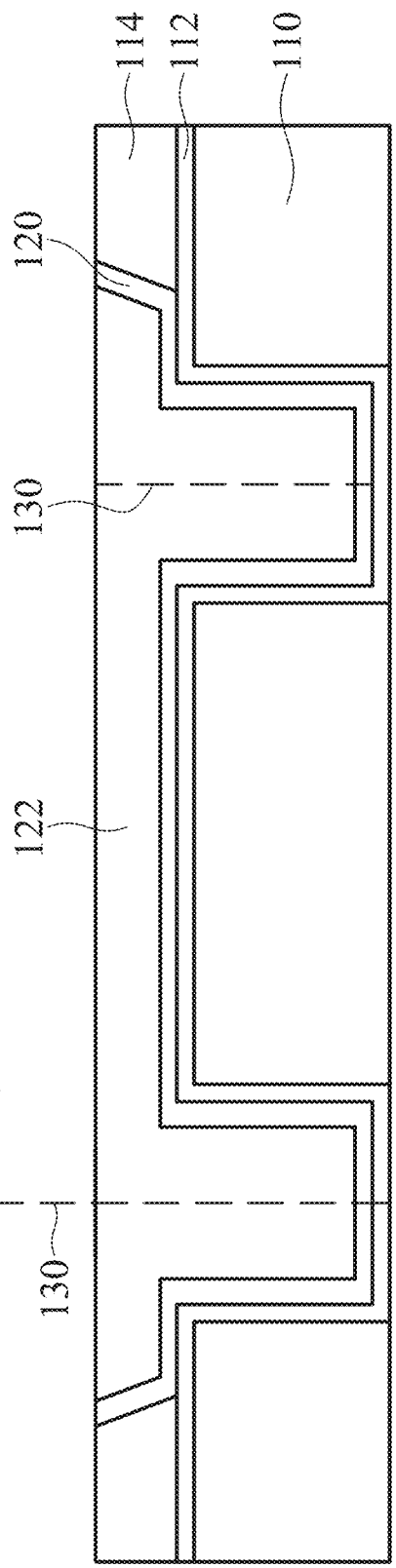
FIG. 10A
FIG. 10B

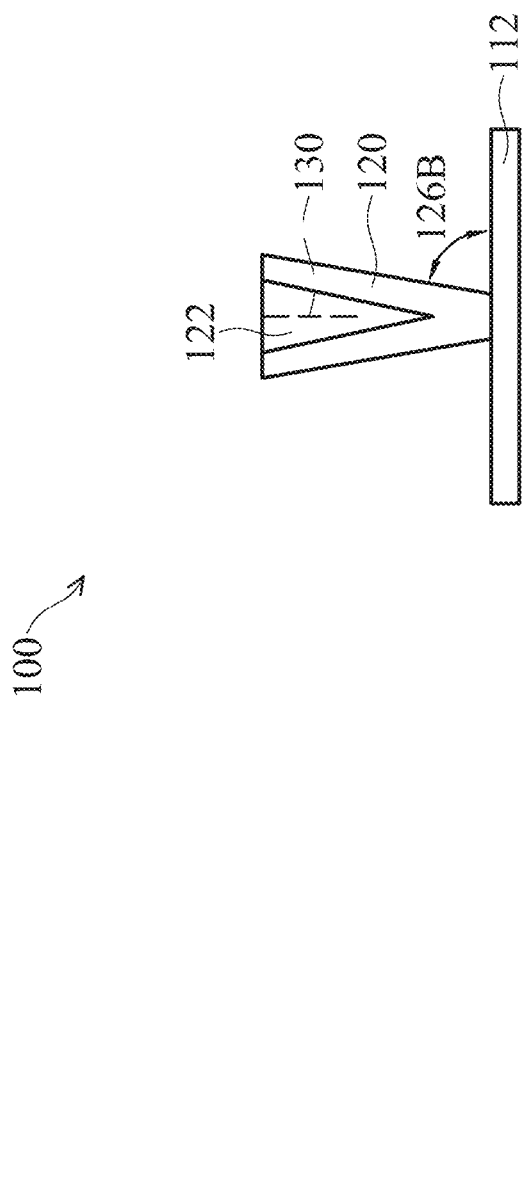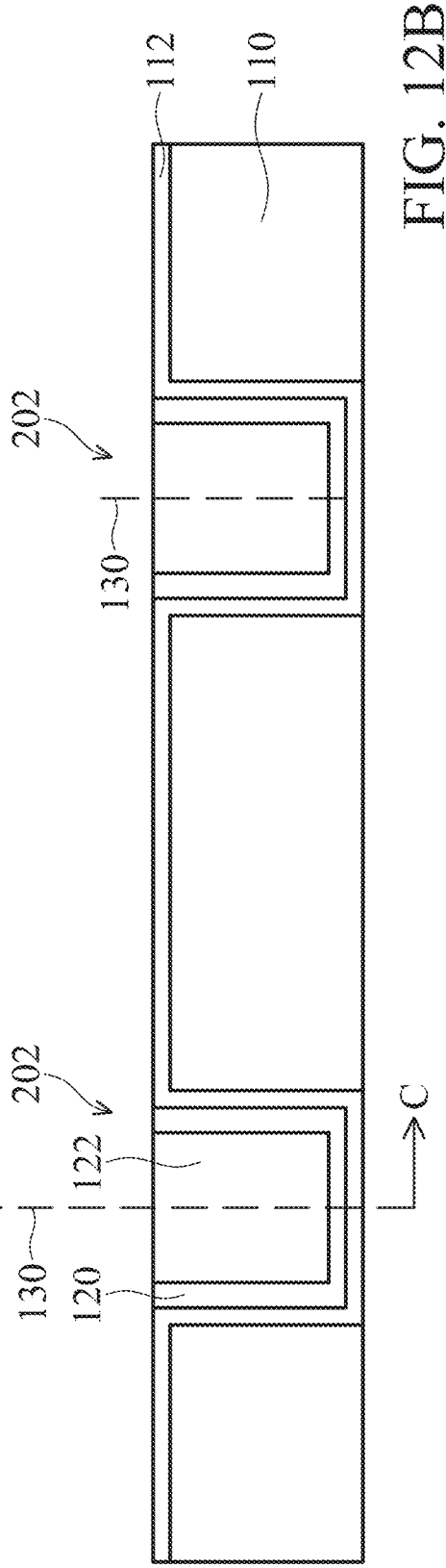

SEMICONDUCTOR DEVICE AND METHOD

PRIORITY CLAIM AND CROSS-REFERENCE

This application is a continuation of U.S. patent application Ser. No. 17/377,813, filed on Jul. 16, 2021, now U.S. Pat. No. 11,948,798, issued Apr. 2, 2024, which is a continuation of U.S. patent application Ser. No. 16/583,949, filed on Sep. 26, 2019, now U.S. Pat. No. 11,069,528 issued Jul. 20, 2021, which claims the benefit of U.S. Provisional Application No. 62/753,184, filed on Oct. 31, 2018, each application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Multi-patterning is a technique used in the photolithographic process that defines the features of integrated circuits at advanced process nodes. It enables designers to develop integrated circuits for manufacture on sub-20 nm process nodes using current optical lithography systems. Multi-patterning is expected to be necessary for the upcoming 10 nm and 7 nm node semiconductor processes and beyond. In multi-patterning a single photolithographic exposure may not be enough to provide sufficient resolution. Hence additional exposures are needed, or else positioning patterns using etched feature sidewalls (using spacers) are necessary to provide the required resolution.

Atomic layer deposition (ALD) is a thin-film deposition technique based on the sequential use of a gas phase chemical process. ALD is a subclass of chemical vapor deposition. The majority of ALD reactions use two chemicals, typically called precursors. These precursors react with the surface of a material one at a time in a sequential, self-limiting, manner. Through the repeated exposure to separate precursors, a thin film is slowly deposited. ALD is used in the fabrication of increased density semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-8C illustrate cross-sectional and perspective views of the hard mask at various intermediate stages of fabrication, in accordance with an embodiment.

FIGS. 9A-13C illustrate cross-sectional views of the hard mask at various intermediate stages of fabrication, in accordance with another embodiment.

DETAILED DESCRIPTION

Figure 1:
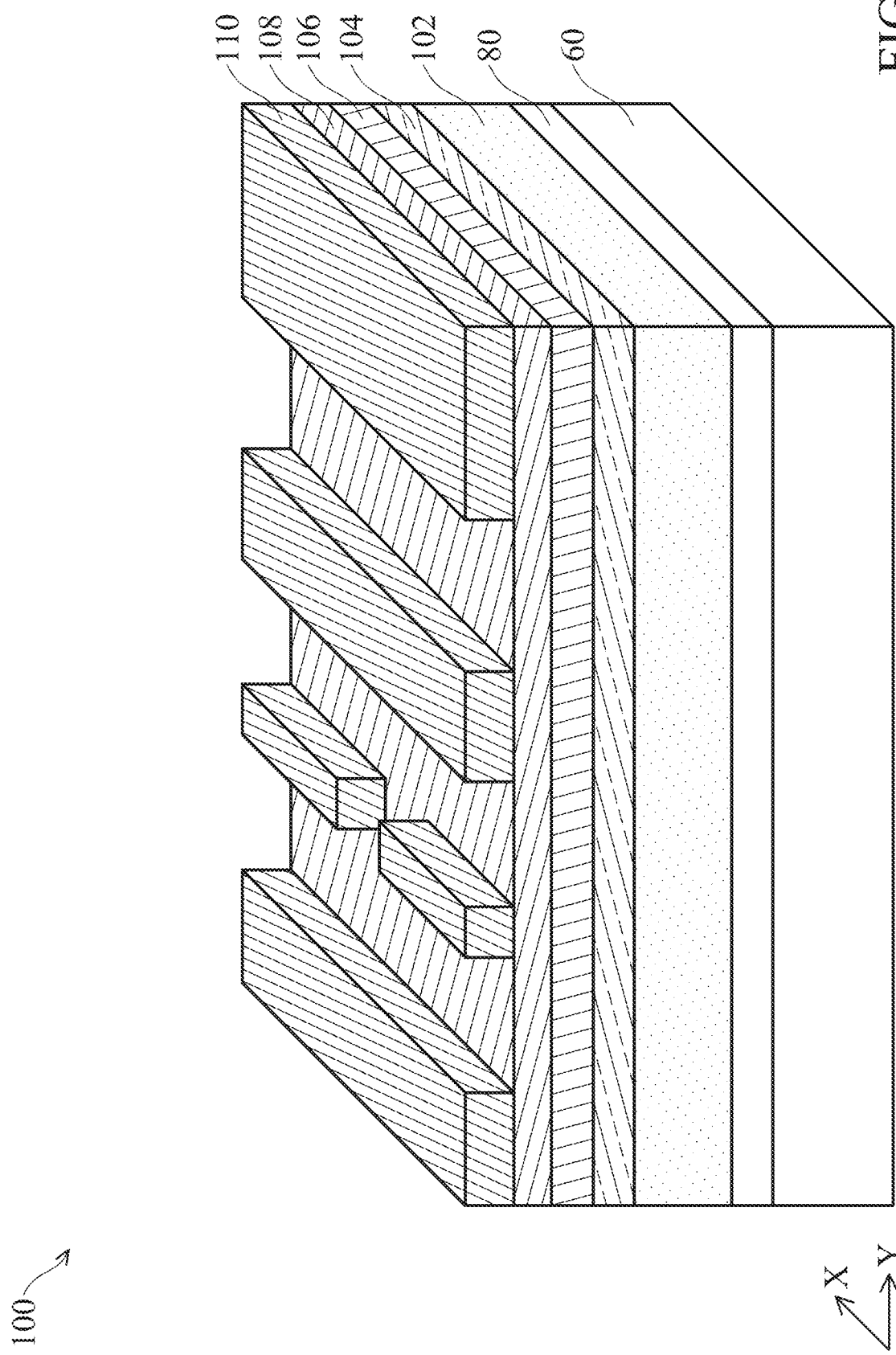
FIGS. 1-3 illustrate perspective views of a hard mask at various initial stages of fabrication, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of improving etch selectivity of a hard mask during device fabrication.

Figure 2:
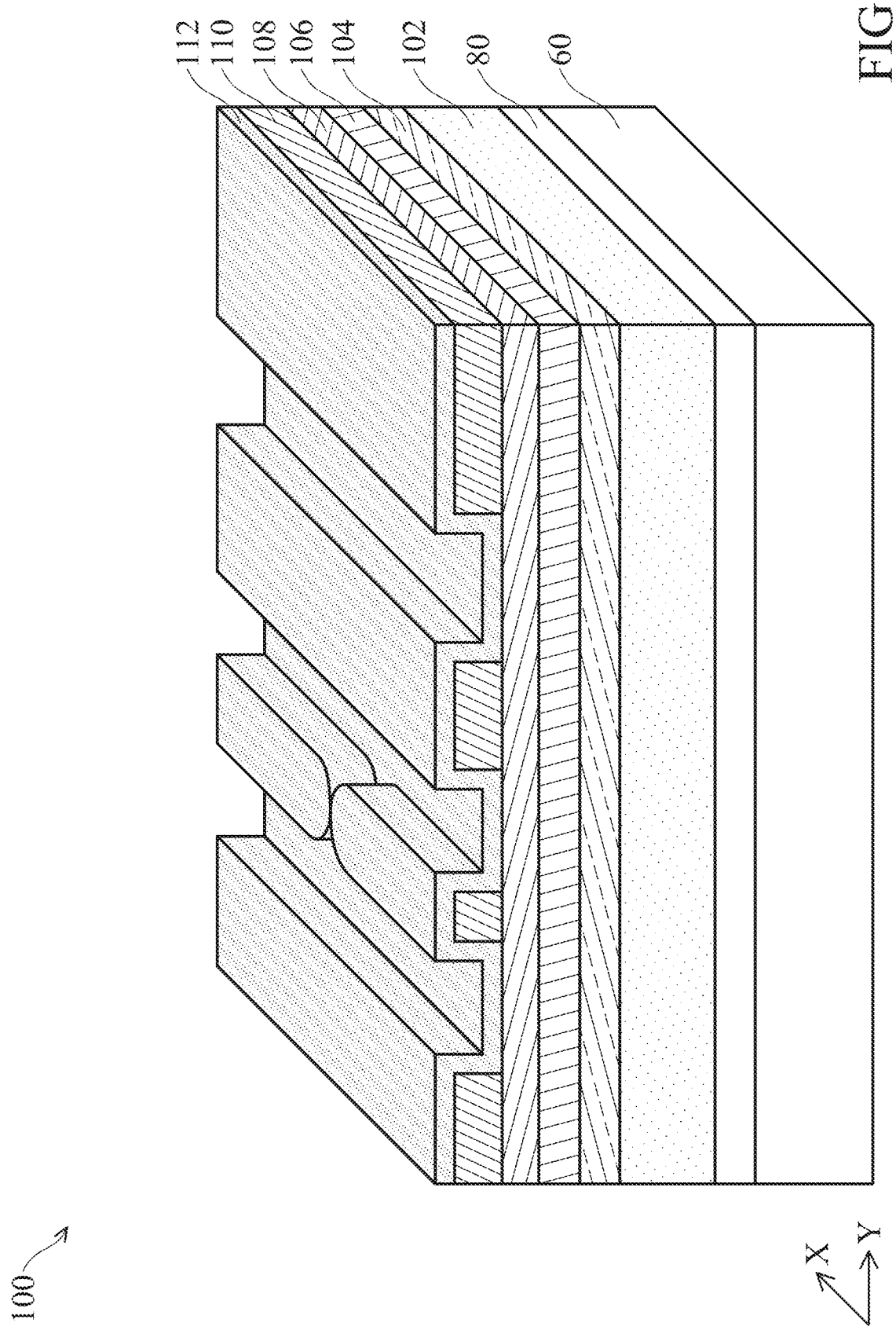
Figure 3:
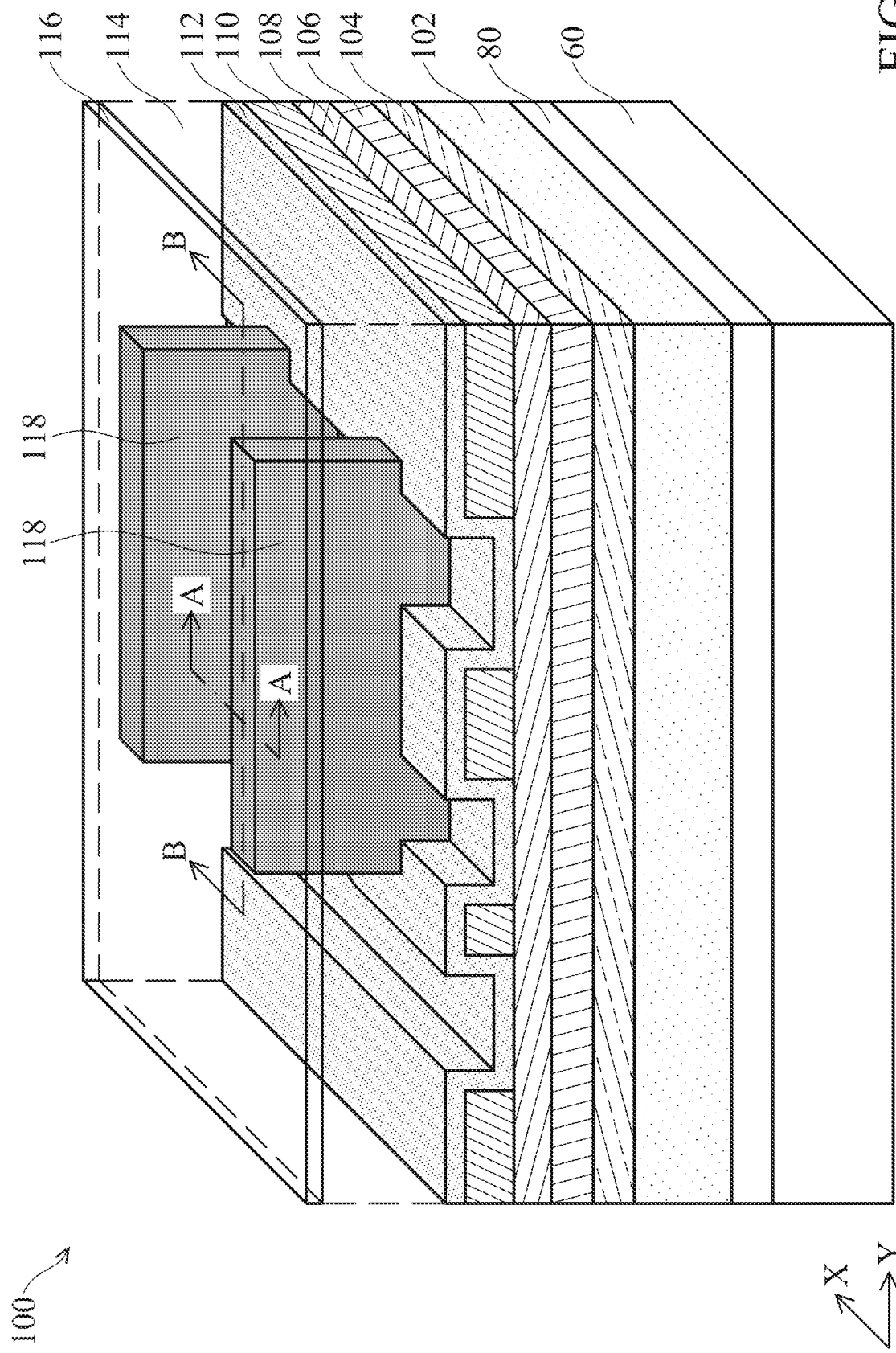

FIGS. 1-3 illustrate perspective views of a hard mask fabrication process at various initial stages of fabrication, in accordance with an embodiment, oriented with respect to a first (x-axis) direction and a second (y-axis) direction.

FIG. 1 illustrates an example of a semiconductor structure 100 including dielectrics, photomasks, and other layers described below disposed over a substrate 60 and a layer to be patterned 80. The substrate 60 may be a semiconductor substrate, such as a bulk semiconductor, a semiconductor-on-insulator (SOI) substrate, or the like, which may be doped (e.g., with a p-type or an n-type dopant) or undoped. The substrate 60 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 60 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The semiconductor substrate may further comprise an active layer (or device region) may include additional semiconductor, metal, and insulating or dielectric layers to form active devices such as transistors including Fin Field-Effect Transistors (FinFETs) as well as passive devices such as resistors and capacitors. The active layer (or device region) may further include conductive features such as contacts (also referred to as contact plugs), e.g., gate contacts and source/drain contacts, that are electrically coupled to the gates and the source/drain regions, respectively, of underlying transistors, including FinFETs.

The layer to be patterned 80 may be a dielectric layer for a metallization layer, may be a layer of semiconductor material, and may be an upper layer of a metallization layer already formed with conductive material, or may even be another masking layer that will be utilized to pattern yet another underlying layer. In an embodiment in which the layer to be patterned 80 is a dielectric layer for a metallization layer, the dielectric layer may be a dielectric material with a dielectric constant between about 1 to about 40. In particular examples the dielectric layer for the layer to be patterned 80 may be silicon oxide, silicon nitride, aluminum oxide, hafnium oxide, lanthanum oxide, other suitable low-k dielectric layers, combinations of these, or the like, formed using such processes as deposition, oxidation, or the like.

In yet another embodiment in which the layer to be patterned 80 is a metallization layer, the layer to be patterned 80 may already be formed with a conductive material using processes such as damascene, dual damascene, deposition and patterning, etc. In a particular embodiment the conductive material for the layer to be patterned 80 comprises at least one metal, metal alloy, metal nitride, metal sulfide, metal selenide, metal oxide, or metal silicide. Particular examples include copper, titanium, aluminum, cobalt, ruthenium, titanium nitride, tungsten nitride ($WN_2$), and tantalum nitride, although any suitable material may alternatively be utilized.

In an embodiment in which the layer to be patterned 80 is a semiconductor material, the layer to be patterned 80 may be a semiconductor substrate with or without intervening active devices, metallization layers, and dielectric material. However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

As shown in FIG. 1, the semiconductor structure 100 may also include a plurality of dielectric layers, including a first dielectric layer 102, a second dielectric layer 104, a third dielectric layer 106, and a fourth dielectric layer 108. In an embodiment the first dielectric layer 102 may be made of one or more suitable dielectric materials such as low-k dielectrics such as SiOCH, other carbon doped oxides, extremely low-k dielectrics such as porous carbon doped silicon dioxide, silicon oxide, silicon nitride, a polymer such as polyimide, combinations of these, or the like. The first dielectric layer 102 may be formed through a process such as a spin-on process or a chemical vapor deposition (CVD), although any suitable process may be utilized, and may have a thickness of between about 400 Å and about 1000 Å, such as about 600 Å.

In an embodiment the second dielectric layer 104 may be an anti-reflective coating (ARC) formed over the first dielectric layer 102. In an embodiment the second dielectric layer 104 may be a nitrogen-free anti-reflective coating such as $SiO_x$ or $SiO_xC_y$, polymer based dielectrics, combinations of these, or the like. The second dielectric layer 104 may be formed using chemical vapor deposition, physical vapor deposition, atomic layer deposition, spin-coating, dip coating, or the like.

Once the second dielectric layer 104 has been formed, the third dielectric layer 106 may be formed over the second dielectric layer 104 to act as a hard mask. In an embodiment the third dielectric layer 106 may be a masking material such as titanium nitride (TiN), although any other suitable material, such as titanium oxide may be used. The third dielectric layer 106 may be formed using a deposition process such as chemical vapor deposition, physical vapor deposition, atomic layer deposition, combinations of these, or the like, and may be formed to a thickness of between about 50 Å and about 800 Å, such as about 300 Å. However, any suitable thickness may be utilized.

The fourth dielectric layer 108 may be formed over the third dielectric layer 106 as another hard mask. In an embodiment the fourth dielectric layer 108 may be, e.g., an oxide formed from tetraethylorthosilicate (TEOS), silicon nitride, another nitrogen-free anti-reflective material, combinations, or these, or the like, although any suitable dielectric material may be used. The fourth dielectric layer 108 may be formed using a plasma enhanced chemical vapor deposition (PECVD) process, although other suitable processes, such as physical vapor deposition or a thermal process, may be used.

FIG. 1 additionally illustrates formation of a patterned layer 110 over the fourth dielectric layer 108. In an embodiment, patterned layer 110 may comprise a patternable material such as silicon which is deposited and then patterned. For example, in embodiments in which silicon is utilized, the patterned layer 110 may be deposited and then patterned using a photolithographic masking and etching process, whereby a photoresist (either by itself or as part of a tri-layer photoresist) is deposited, exposed, and developed, and then the photoresist is utilized as a mask during an anisotropic etching process. However, any suitable material and method of manufacture and/or patterning can be utilized.

FIG. 2 illustrates the deposition of mask layer 112 over the patterned layer 110 that forms part of the hard mask features 202 (not illustrated in FIG. 2 but illustrated and described below with respect to FIGS. 8A and 13A) for defining features in the first (x-axis) direction. In an embodiment the mask layer 112 may be formed of a material such as titanium oxide (TiO) using a method such as chemical vapor deposition, physical vapor deposition, atomic layer deposition, combinations of these, or the like. However, any suitable material and method of manufacture may be utilized.

FIG. 3 illustrates the deposition of a first photomask layer 114 and a second photomask layer 116 over the mask layer 112. In an embodiment the first photomask layer 114 may be a bottom layer of a multi-layer photoresist, and may comprise an organic or inorganic material that has an etch selectivity to the second photomask layer 116. As such, the second photomask layer 116 can be used as a mask layer to pattern the first photomask layer 114.

The second photomask layer 116 may comprise a photosensitive material by itself or, in other embodiments, may be a bi-layer structure with a photosensitive material over another, middle layer of material such as silicon nitride, silicon oxynitride, SiOC, or the like to form a tri-layer photoresist along with the first photomask layer 114. Any suitable deposition method, such as PVD, CVD, spin coating, the like, or combinations thereof, may be used to form second photomask layer 116.

Once the first photomask layer 114 and the second photomask layer 116 have been formed, an opening 118 (e.g., two or more openings or trenches) is formed in the second photomask layer 116. In an embodiment, the second photomask layer 116 may be patterned by exposing the photosensitive material within the second photomask layer 116 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photomask layer 116 are different from the physical properties of the unexposed portions of the second photomask layer 116. The second photomask layer 116 may then be developed with, e.g., a developer (not separately illustrated in FIG. 3), in order to separate the exposed portion of the second photomask layer 116 from the unexposed portion of the second photomask layer 116.

Next, the opening 118 in the second photomask layer 116 is extended through the bottom first photomask layer 114 (or the bottom first photomask layer 114 and the middle layer when the middle layer is present), using, for example, one or more anisotropic etching processes. In an embodiment the opening 118 is extended all of the way through the first photomask layer 114 so as to expose each portion of the mask layer 112 that is present underneath the opening 118. As such, extension of the opening 118 forms trenches which may have a high aspect ratio, such as having an aspect ratio of between about 5 and about 50 in at least one direction. However, any suitable aspect ratio may be utilized.

FIG. 4A shows a cross-sectional view of a portion of an semiconductor structure 100 along line A-A from FIG. 3 (with layers located below the mask layer 112 being excluded from FIG. 4A for clarity), including mask layer 112 and first photomask layer 114 which can be used to help achieve metal line end critical dimension (CD) shrinkage and increase the pattern fail window. In an embodiment, prior to further processing the second photomask layer 116 is removed using, for example one or more ashing or etching processes. Once the second photomask layer 116 has been removed, a first gap-filling material 120 is deposited into the openings 118 in order to protect the structures from photoresist (PR) or polymer damage and critical dimension (CD) shrinkage due to further plasma processing.

In an embodiment the composition of the first gap-filling material 120 can be $SiO_x$, $SiC_xO_y$, SiC or a-C (amorphous carbon). The first gap-filling material 120 can be deposited using a deposition process such as atomic layer deposition (ALD), chemical vapor deposition (CVD), or physical vapor deposition (PVD). In an embodiment in which the first gap-filling material 120 is formed using an ALD deposition process, the ALD process may utilize a series of repeated cycles whereby a first precursor is pulsed into a deposition chamber to react with the first photomask layer 114, the first precursor is purged, a second precursor is pulsed into the deposition chamber to react with the first precursor, the second precursor is purged, and the cycle is repeated.

In an embodiment the first precursor may be a precursor such as tris(dimethylamino)silane (3DMAS), bis(tertiary-butyl-amino) silane (BTBAS), bis(diethylamino)silane (BDEAS), methane ($CH_4$) or ethylene ($C_2H_4$) and acetylene (CH), combinations of these, or the like. The second precursor may be a corresponding reaction gas such as an Ar-containing, oxygen-containing, $N_2$-containing or $CO_2$ gas, including Ar, $O_2$, $CO_2$, or $N_2O$. By utilizing these precursors, each cycle of the atomic layer deposition process forms a monolayer of the desired material, with each successive and repeated cycle forming an additional monolayer of material.

Additionally, in some embodiments the temperature of the deposition process of the first gap-filling material 120 is kept at a low enough temperature to avoid decomposition of the polymer based materials that are present, such as the first photomask layer 114. For example, the temperature of the ALD process may be kept lower than 300° C. For example, a range of temperatures from room temperature to 300° C. can be used, in an embodiment. Additionally, by keeping the temperature below 200° C., such as between room temperature and 200° C., undesired outgassing can also be avoided. However, in other embodiments in which decomposition is not an issue, any suitable temperature may be utilized.

By using an ALD process, the first gap-filling material 120 can be built up uniformly and with high precision along the sidewalls of the first photomask layer 114. However, given the reactions of the ALD process, and the small number of cycles in forming the first gap-filling material 120, the first gap-filling material 120 is not deposited along the bottom of the opening 118 (because the first precursor and the second precursor do not chemically react with the material of the mask layer 112). Additionally, the first gap-filling material 120 can be deposited to a thickness that is sufficient to keep the first gap-filling material 120 from covering the bottom of the opening 118, such as having a thickness (measured on an upper surface of the first photomask layer 114) of about 50 Angstroms with a thickness range between 10 Angstroms and 100 Angstroms, in an embodiment.

FIG. 4A additionally illustrates that, subsequent to the deposition of the first gap-filling material 120, a second gap-filling material 122 is deposited to at least partially fill or completely fill opening 118. Note that the first gap-filling material 120 and the second gap-filling material 122 thus both extend beyond a plane defined by the upper surface of first photomask layer 114.

In an embodiment the second gap-filling material 122 may be deposited in-situ (e.g., in the same deposition chamber as the first gap-filling material 120) using a same deposition process as the first gap-filling material 120, such as ALD, CVD or PVD. In an embodiment the second gap-filling material 122 may be a material different from the first gap-filling material 120 so that the second gap-filling material 122 can be used for etch selectivity enhancement or thermal selectivity enhancement. In particular embodiments the second gap-filling material 122 may be a metal oxide such as titanium oxide (TiO) or aluminum oxide ($Al_2O_3$) or the like or a metal nitride such as titanium nitride (TiN) or the like. However, any suitable materials may be utilized.

In a particular embodiment in which ALD is utilized to deposit the second gap-filling material 122, the ALD process may utilize a third precursor such as trimethylaluminum (TMA, $Al(CH_3)_3$), diethylzinc (DEZ), tetrakis(dimethylamino)titanium (TDMAT), titanium isopropoxide (TTIP), $TiCl_4$, tetrakis(dimethylamido)zirconium ($Zr(NMe_2)_4$), zirconium tetrachloride ($ZrCl_4$) or tetrakis-dimethyl-amine tin (TDMASn). Additionally, the ALD process to deposit the second gap-filling material 122 can also use a fourth precursor from an oxygen source such as $H_2O$, $O_2$, $O_3$, or $H_2O_2$, or other compounds. However, any suitable precursors or methods of deposition may be utilized.

The second gap-filling material 122 may be deposited to a thickness sufficient to fill at least a bottom portion of the openings 118. In an embodiment the second gap-filling material 122 may be deposited to a thickness (measured outside of the opening 118) of between about 300 Å and about 490 Å, such as about 400 Å. However, any suitable thickness may be utilized.

Additionally, in some embodiments the temperature of the deposition process of the second gap-filling material 122 is kept at a low enough temperature to avoid decomposition of the polymer based materials that are present, such as the first photomask layer 114. For example, the temperature of the ALD process may be kept lower than 300° C. For example, a range of temperatures from room temperature to 300° C. can be used, in an embodiment. Additionally, by keeping the temperature below 200° C., such as between room temperature and 200° C., undesired outgassing can also be avoided. However, in other embodiments in which decomposition is not an issue, any suitable temperature may be utilized.

Finally, in embodiments in which an ALD process is utilized to deposit the second gap-filling material 122, the second gap-filling material 122 may have an indentation that is centered within the opening 118. As such, the thickness of the second gap-filling material 122 reaches a maximum thickness at the center line 130 of opening 118 due to the geometry of the opening 118. However, in other embodiments which completely overfill the opening 118, the indentation may not be present.

FIG. 4B shows a cross-sectional view of a portion of the semiconductor structure 100 along line B-B from FIG. 3 while FIG. 4A illustrates the structure of FIG. 4B along line C-C in FIG. 4B, including patterned layer 110, mask layer 112 and first photomask layer 114 (with structures below the patterned layer 110 being removed from FIG. 4B for clarity). As can be seen, and consistent with FIG. 4A, the first gap-filling material 120 and the second gap-filling material 122 as previously described are both used to fill openings 118. In particular, opening 118 is partially filled with the first gap-filling material 120, covering sidewalls of mask layer 112 and first photomask layer 114 in a first ALD processing step, although the bottom of opening 118 is not covered with the first gap-filling material 120, in an embodiment. Subsequently, at least a bottom portion of opening 118 is filled with the second gap-filling material 122, in an embodiment.

As can be seen, the mask layer 112, the first gap-filling material 120 and the second gap-filling material 122 extend from over a top surface of the first photomask layer 114 into a portion of the opening 118 which extends into the first photomask layer 114. The mask layer 112, the first gap-filling material 120 and the second gap-filling material 122 also extend into the opening 118 as the opening 118 extends into the patterned layer 110.

In FIG. 5A and FIG. 5B, a removal process is performed to remove excess materials of the first gap-filling material 120 and the second gap-filling material 122, with FIG. 5A illustrating a cross-sectional view of a portion of the semiconductor structure 100 along line A-A from FIG. 3 while FIG. 5B illustrates a cross-sectional view of a portion of the semiconductor structure 100 along line B-B from FIG. 3 and FIG. 5A illustrating the structure of FIG. 5B along line C-C in FIG. 5B. In an embodiment the removal process may be performed using a chemical-mechanical polishing (CMP) step or etching step such as using a $C_xF_y/C_xH_yF_z$ based gas to planarize the surface of mask layer 114 as well as the upper surfaces of the first gap-filling material 120 and the second gap-filling material 122. However, any suitable removal process may be utilized.

Figure 6A:
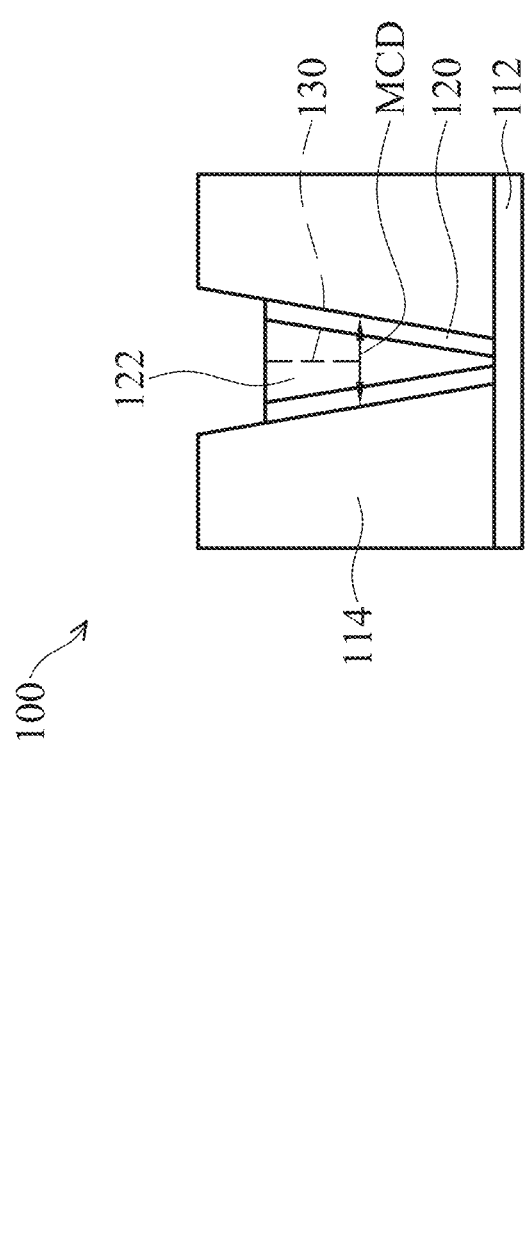
Figure 6B:
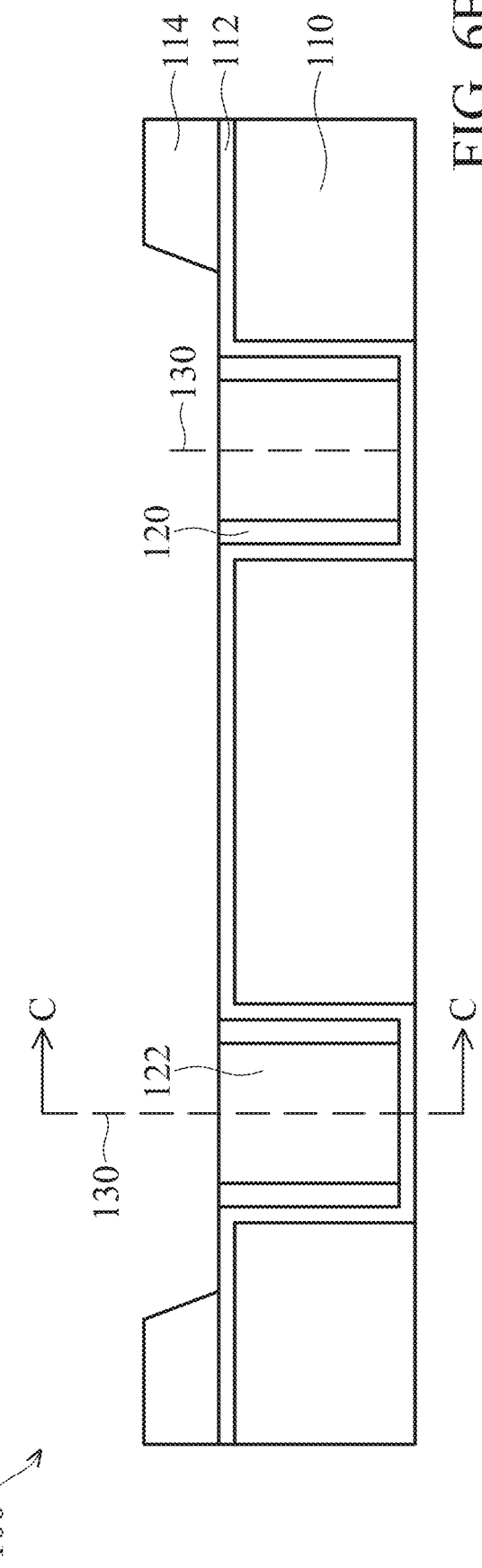

In FIGS. 6A and 6B, the height of the first gap-filling material 120 and the second gap-filling material 122 can be reduced in order to remove the first gap-filling material 120 and the second gap-filling material 122 from overlying the patterned layer 110, with FIG. 6A illustrating a cross-sectional view of a portion of the semiconductor structure 100 along line A-A from FIG. 3 and FIG. 6B illustrating a cross-sectional view of a portion of the semiconductor structure 100 along line B-B from FIG. 3 and FIG. 6A illustrating the structure of FIG. 6B along line C-C in FIG. 6B. In an embodiment the height of the first gap-filling material 120 and the second gap-filling material 122 can be reduced to be at least co-planar with a top surface of mask layer 112 using, e.g., one or more anisotropic etching processes, such as an anisotropic etching process using an etchant such as a $C_xF_y/C_xH_yF_z$ based gas. However, any suitable reduction process may be utilized.

Figure 7C:
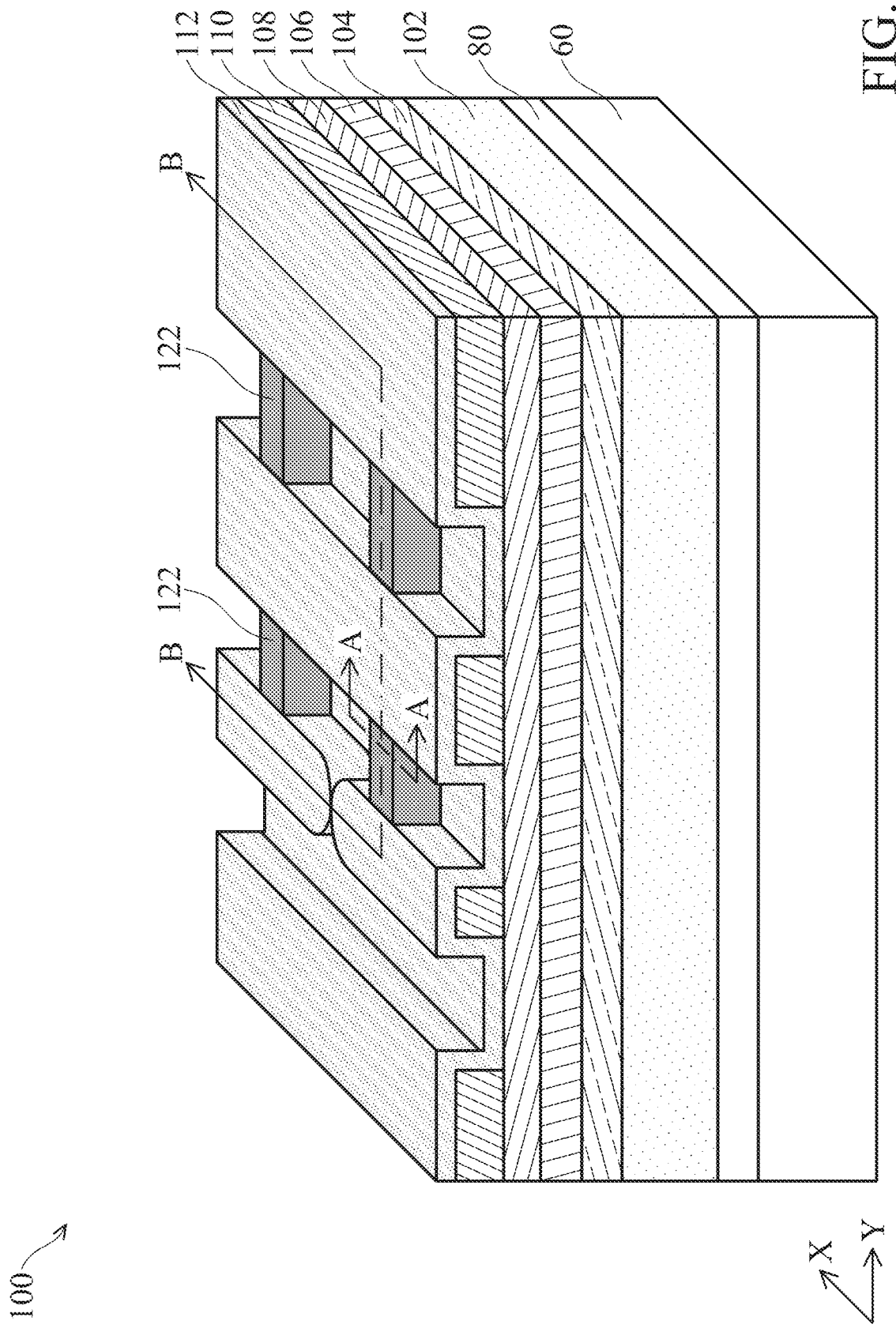

In FIGS. 7A, 7B and 7C, the first photomask layer 114 and the first gap-filling material 120 are both removed, with FIG. 7A illustrating a cross-sectional view of a portion of the semiconductor structure 100 along line A-A from FIG. 7C while FIG. 7B illustrates a cross-sectional view of a portion of the semiconductor structure 100 along line B-B from FIG. 7C and FIG. 7A illustrating the structure of FIG. 7B along line C-C in FIG. 7B. In an embodiment the removal may be performed with one or more ashing or etching steps using etchants such as $O_2$ based gas. In a particular embodiment the first photomask layer 114 may be removed using an ashing process, while the first gap-filling material 120 is removed using a plasma based $O_2$ gas as an etchant. However, any suitable removal processes, such as wet etching process, may also be utilized.

Due to the high etch selectivity between the first gap-filling material 120 and the second gap-filling material 122, the first gap-filling material 120 can be removed along with the first photomask layer 114. As such, only the second gap-filling material 122 will remain after the removal process. Furthermore, the etch selectivity between the second gap-filling material 122 and the patterned layer 110 is also high enough to prevent damage to the patterned layer 110, thereby helping to prevent pattern failure.

After the removal of the first photomask layer 114 and the first gap-filling material 120, the second gap-filling material 122 will have a sidewall which intersects the mask layer 112 at a first angle 126A. In an embodiment the first angle 126A is between about 75 degrees and about 90 degrees, such as about 85 degrees. However, any suitable angle may be utilized.

Additionally, and as can be seen in FIG. 7B, the removal of the first photomask layer 114 and the first gap-filling material 120 will also create a "gap" in the "y-axis" between the second gap-filling material 122 and the mask layer 112 located on sidewalls of the patterned layer 110. While this gap is present, the remaining hard mask feature 202 comprising the second gap-filling material 122 will still act as a hard mask during the following processing steps.

FIG. 7C shows the structure of FIGS. 7A-7B located over the first dielectric layer 102, the second dielectric layer 104, the third dielectric layer 106, and the fourth dielectric layer 108, previously described. Also shown are the patterned layer 110, and the mask layer 112 that will be used to pattern the underlying structures. The first dielectric layer 102, the second dielectric layer 104, the third dielectric layer 106, the fourth dielectric layer 108, the patterned layer 110, and the mask layer 112 are substantially the same as were previously shown and described in FIGS. 1-3, except that the first photomask layer 114 and the second photomask layer 116 have been are removed. However, as can be seen, the second gap-filling material 122 has now been formed within the trenches of the mask layer 112.

Figure 8A:
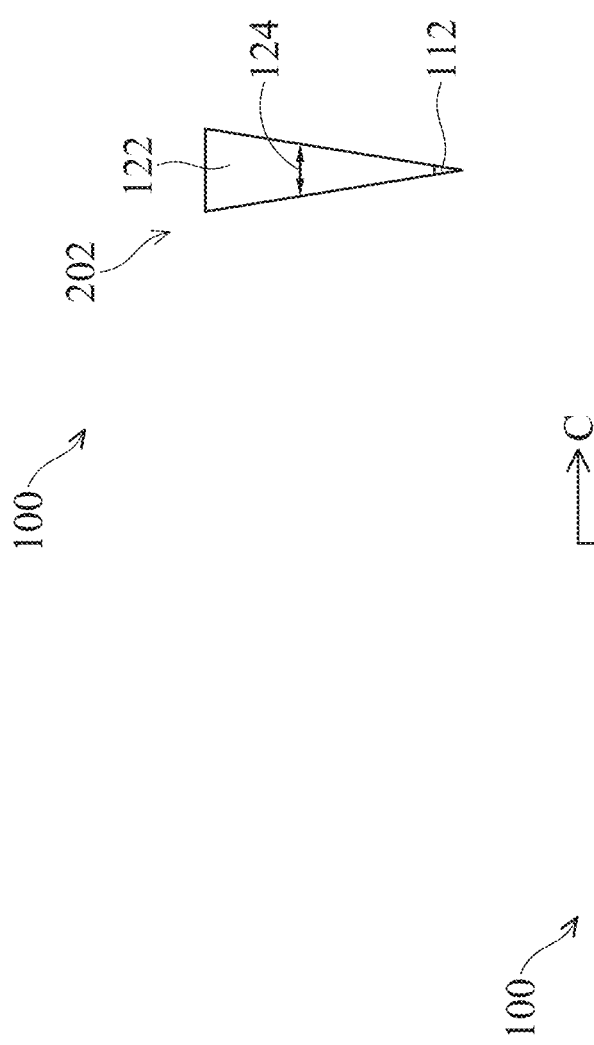
Figure 8B:
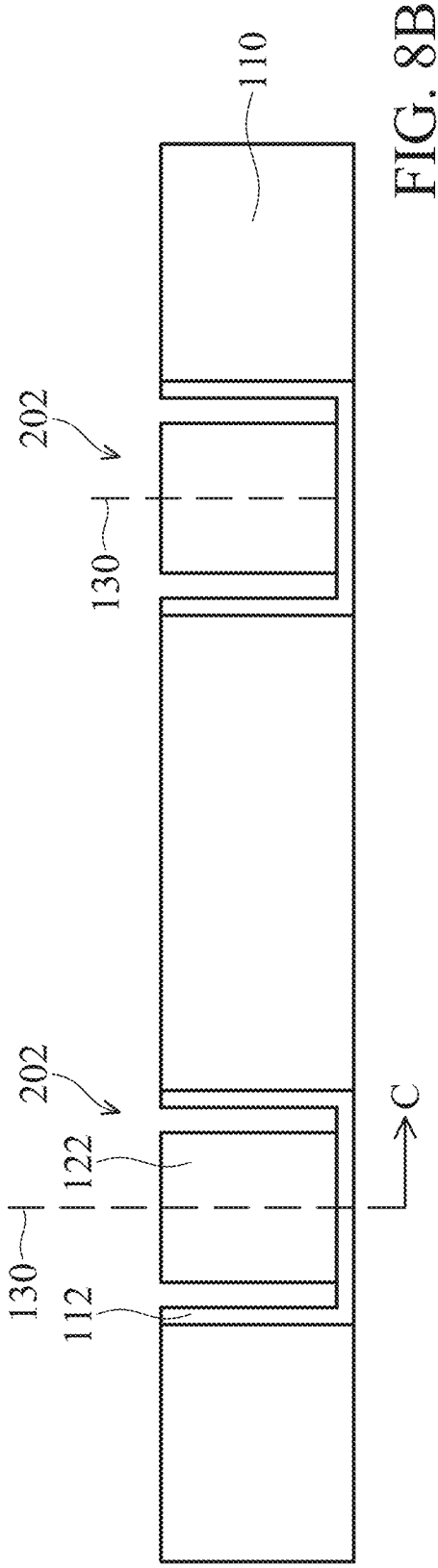
Figure 8C:
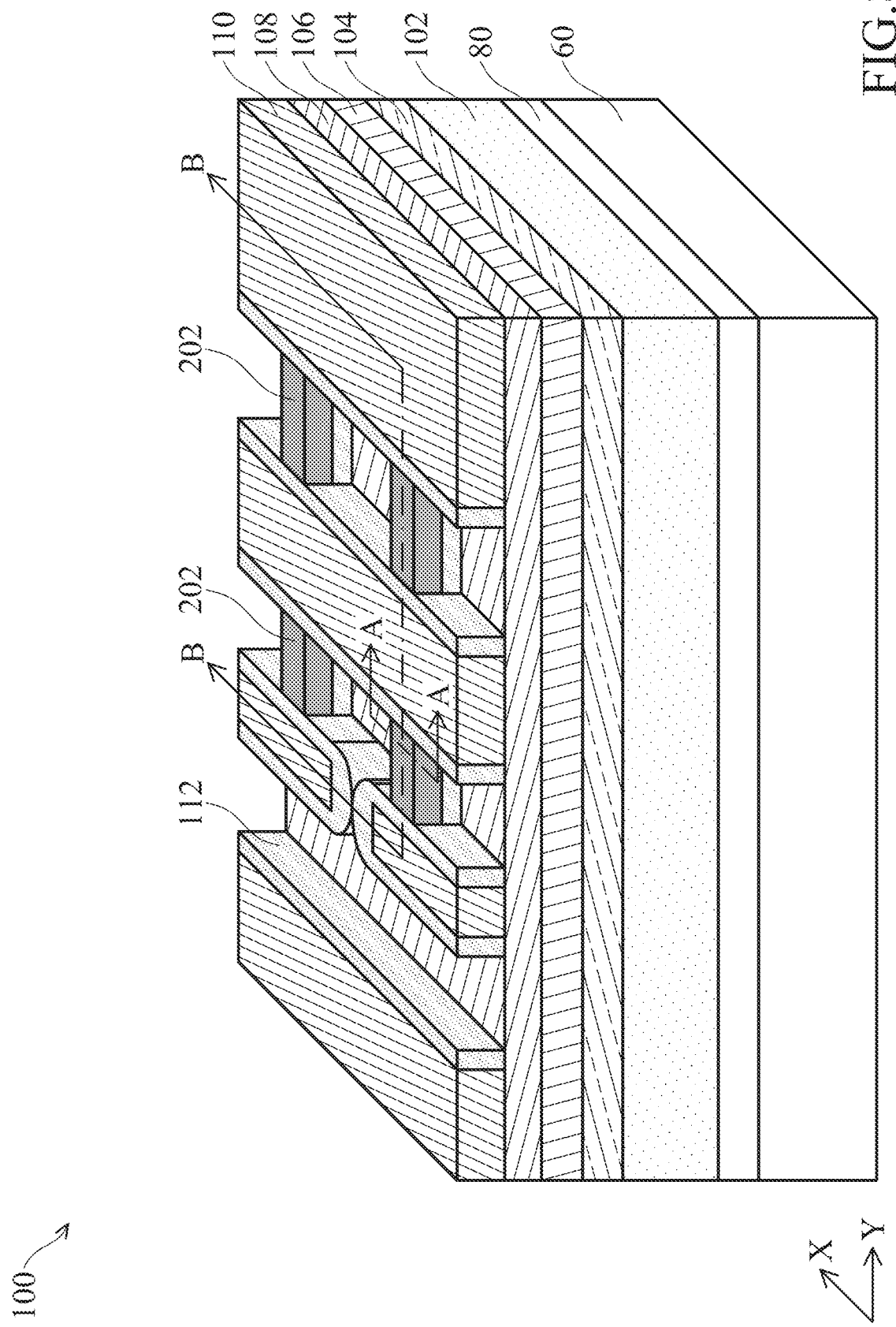

FIGS. 8A-8C illustrate a patterning of the mask layer 112 using the second gap-filling material 122 as a mask to form a hard mask feature 202 (comprising both the second gap-filling material and the mask layer 112), with FIG. 8A illustrating a cross-sectional view of a portion of the semiconductor structure 100 along line A-A from FIG. 8C while FIG. 8B illustrates a cross-sectional view of a portion of the semiconductor structure 100 along line B-B from FIG. 8C and FIG. 8A illustrating the structure of FIG. 8B along line C-C in FIG. 8B. In an embodiment the mask layer 112 may be patterned using one or more etching processes, such as an anisotropic etching process using an etchant such as $C_xF_y$, $C_xH_yF_z$, or $C_xH_yCl_z$ based gas. However, any suitable etching process may be utilized.

By first filling the opening 118 (see FIGS. 4A-4B) and then removing the outside layers of material, the hard mask feature 202 can be formed with the high aspect ratio of the opening 118. As such, the hard mask feature can be formed with a middle critical dimension 124 (MCD—e.g., the width of the hard mask feature 202 at one-half of the height of the hard mask feature 202) of about 30 nm and a typical height of about 50 nm. However, the MCD can range from between about 10 nm to about 30 nm and the height of the hard mask feature 202 can range between about 20 nm and 60 nm. Any suitable dimensions may be utilized.

FIG. 8B illustrates another view of the etching of the mask layer 112 to form the hard mask feature 202. Additionally, as can be seen more clearly in FIG. 8B, during the etch of the mask layer 112, the selectivity between the mask layer 112 and the second gap-filling material 122 may not be high enough, and the etching process may simultaneously also etch the second gap-filling material 122 at a reduced rate, thereby reducing the height of the second gap-filling material 122.

FIG. 8C illustrates the structures of FIGS. 8A and 8B over the first dielectric layer 102, the second dielectric layer 104, the third dielectric layer 106, and the fourth dielectric layer 108, previously described. As can be seen, the hard mask features 202 (located between portions of the patterned layer 110) are fully formed. Additionally, portions of the mask layer 112 remain along sidewalls of the patterned layer 110, while upper surfaces of the patterned layer 110 are exposed.

Before continuing the described process, another embodiment for forming the hard mask features 202 in FIGS. 8A through 8C is described with respect to FIGS. 9A-13C. In this embodiment a second alternative process flow is described for backfilling the openings 118 (see, e.g., FIG. 3) and then removing only the first photomask layer 114 so that both the first gap-filling material 120 and the second gap-filling material 122 remain. As such, in this embodiment the hard mask feature 202 comprises the first gap-filling material 120, the second gap-filling material 122, and the mask layer 112.

Looking first at FIG. 9A, FIG. 9A shows a cross-sectional view of a portion of the semiconductor structure 100 along line A-A from FIG. 3, including mask layer 112 and first photomask layer 114 (with layers located below the mask layer 112 being excluded from FIG. 9A for clarity). In an embodiment the first gap-filling material 120 is deposited as described above with respect to FIG. 4A, such as using an atomic layer deposition (ALD) process. However, in this embodiment the ALD process is continued to grow the first gap-filling material 120 on the sidewalls of the first photomask layer 114 until the portions merge together and cover a bottom of the opening 118.

In a particular embodiment the ALD process may be continued for at least five cycles of the ALD process (e.g., introduction of the first precursor, purging of the first precursor, introduction of the second precursor, purging of the second precursor), such as between 5 cycles and 10 cycles. As such, the first gap-filling material 120 is formed such that the first gap-filling material 120 has a thickness outside of the opening 118 on an upper surface of the first photomask layer 114 of about 100 Angstroms with a range of 50 Angstroms to 150 Angstroms. However, any suitable thickness may be utilized.

Additionally, while the precursors used for the described ALD process will not react with the exposed portion of the mask layer 112, by performing the ALD process for more than five cycles, a small portion of the mask layer 112 will still be formed over the exposed portion of the mask layer 112. In particular, while the precursors will not react with the material of the mask layer 112, the material of the mask layer 112 will still absorb the precursor with each cycle. As such, after at least five cycles the absorbed precursors located along the surface of the mask layer 112 may still be present during an introduction of the second precursor, thereby initiating a reaction between precursors along the top surface of the mask layer 112, even though no chemical reaction occurs between the material of the mask layer 112 and the precursors.

However, by forming the first gap-filling material 120 along the surface of the mask layer 112 in this fashion, the first gap-filling material 120 along the surface of the mask layer 112 will have a much smaller thickness than the remaining portions of the first gap-filling material 120. In some embodiments of the first gap-filling material 120 along the surface of the mask layer 112 has a thickness of between about 10 Angstroms and about 100 Angstroms, such as about 50 Angstroms. However, any suitable thickness may be utilized.

Once the first gap-filling material 120 has been deposited, the second gap-filling material 122 may be deposited. In an embodiment the second gap-filling material 122 may be deposited as described above with respect to FIG. 4A, such as by using an ALD process to fill at least a portion of the opening 118. In other embodiments the deposition process can fully fill the opening 118. In a particular embodiment the thickness of the second gap-filling material 122 outside of the opening 118 is about 350 Angstroms with a range of 250 Angstroms to 440 Angstroms.

Additionally, in embodiments in which an ALD process is utilized to deposit the second gap-filling material 122, the second gap-filling material 122 may have an indentation that is centered within the opening 118. As such, the thickness of the second gap-filling material 122 reaches a maximum thickness at the center line 130 of opening 118 due to the geometry of the opening 118. However, in other embodiments which completely overfill the opening 118, the indentation may not be present.

FIG. 9B shows a cross-sectional view of a portion of the semiconductor structure 100 along line B-B from FIG. 3, while FIG. 9A illustrates the structure of FIG. 9B along line C-C in FIG. 9B, including the patterned layer 110, the mask layer 112 and the first photomask layer 114 (with structures below the patterned layer 110 being removed from FIG. 9B for clarity). As can be seen, and consistent with FIG. 9A, the first gap-filling material 120 and the second gap-filling material 122 as previously described are both used to fill openings 118. In particular, opening 118 is partially filled with the first gap-filling material 120, covering sidewalls of the first photomask layer 114 in a first ALD processing step, while also covering the bottom of opening 118 with the first gap-filling material 120 (although at a reduced thickness), in an embodiment. Subsequently, at least a bottom portion of opening 118 is filled with the second gap-filling material 122, in an embodiment.

In FIGS. 10A and FIG. 10B, a removal process is performed to remove excess materials of the first gap-filling material 120 and the second gap-filling material 122, with FIG. 10A illustrating a cross-sectional view of a portion of the semiconductor structure 100 along line A-A from FIG. 3 while FIG. 10B illustrates a cross-sectional view of a portion of the semiconductor structure 100 along line B-B from FIG. 3 and FIG. 10A illustrating the structure of FIG. 10B along line C-C in FIG. 10B. In an embodiment the removal process may be performed as described above with respect to FIGS. 5A-5B, such as by using a chemical-mechanical polishing (CMP) step or etching step such as using a $C_xF_y/C_xH_yF_z$ based gas to planarize the surface of first photomask layer 114 as well as the upper surface of first gap-filling material 120 and the second gap-filling material 122. However, any suitable removal process may be utilized.

Figure 11A:
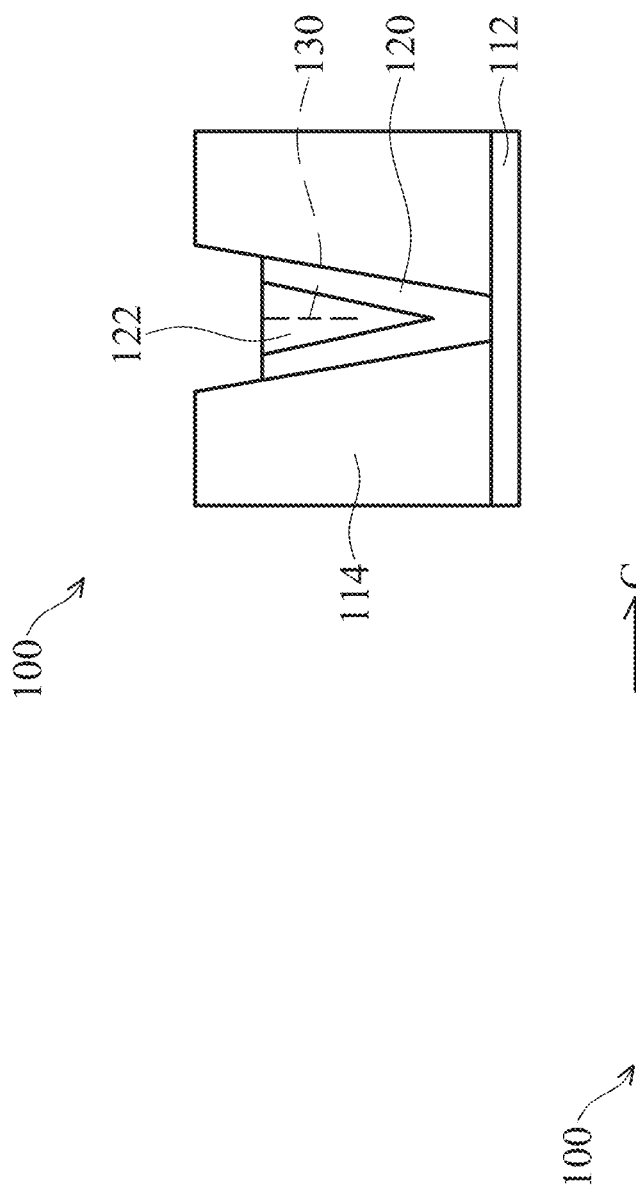
Figure 11B:
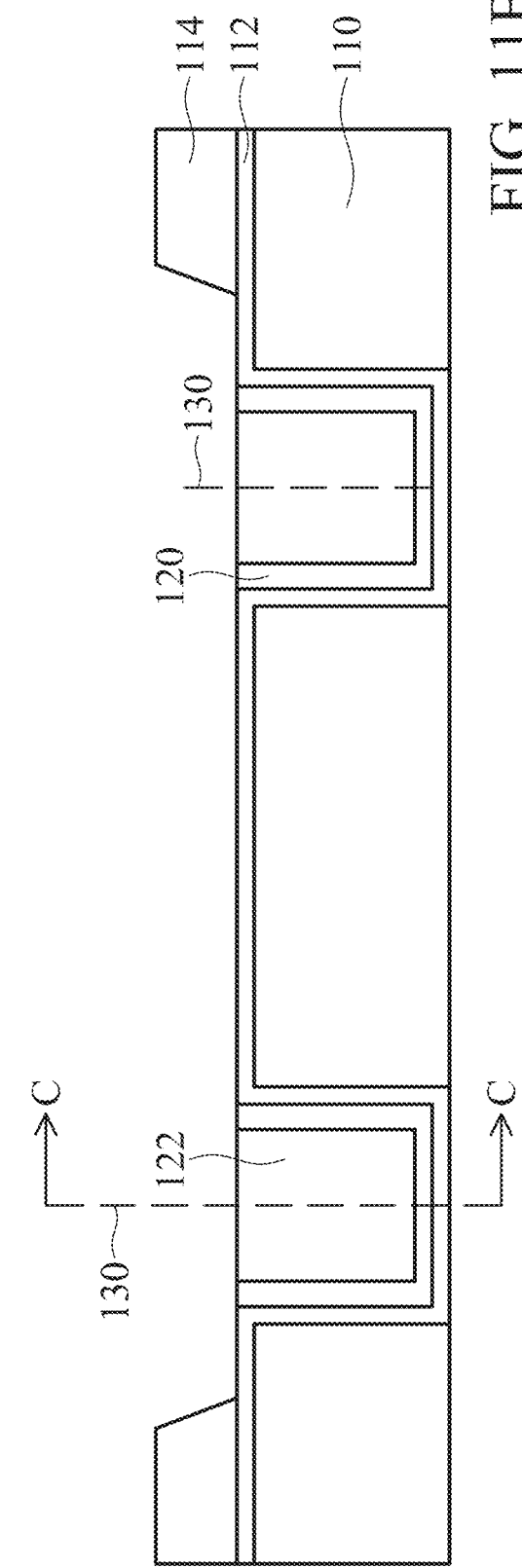

In FIGS. 11A and 11B, the height of the first gap-filling material 120 and the second gap-filling material 122 can be reduced in order to remove these materials from being located over the patterned layer 110, with FIG. 11A illustrating a cross-sectional view of a portion of the semiconductor structure 100 along line A-A from FIG. 3 while FIG. 11B illustrates a cross-sectional view of a portion of the semiconductor structure 100 along line B-B from FIG. 3 and FIG. 11A illustrating the structure of FIG. 11B along line C-C in FIG. 11B. In an embodiment the height of the first gap-filling material 120 and the second gap-filling material 122 can be reduced as described above with respect to FIG. 6A-6B, such as by being reduced to be at least co-planar with a top surface of the mask layer 112 using, e.g., one or more anisotropic etching processes, such as an anisotropic etching process using an etchant such as a $C_xF_y/C_xH_yF_z$ based gas. However, any suitable reduction process may be utilized.

In FIGS. 12A and 12B, the first photomask layer 114 is removed, with FIG. 12A illustrating a cross-sectional view of a portion of the semiconductor structure 100 along line A-A from FIG. 3 while FIG. 12B illustrates a cross-sectional view of a portion of the semiconductor structure 100 along line B-B from FIG. 3 and FIG. 12A illustrating the structure of FIG. 12B along line C-C in FIG. 12B. In an embodiment the removal of the first photomask layer 114 may be performed with one or more ashing or etching process steps. However, any suitable removal steps may be performed.

Additionally, if desired, after the photomask 114 has been removed, the first gap-filling material 120 may also be etched in order to reduce the thickness of the first gap-filling material 120 (and thereby reduce the width of the combination of the first gap-filling material 120 and the second gap-filling material 122). In an embodiment the material of the first gap-filling material 120 may be reduced using an etching process that utilizes etchants such as an oxygen based plasma etchant.

However, unlike the previous embodiment described with respect to FIGS. 4A-8C, the etching process utilized to reduce the thickness of the first gap-filling material 120 is terminated prior to fully removing the material of the first gap-filling material 120. In an embodiment the first gap-filling material 120 may be reduced to have a thickness of between about 0 Angstroms and about 50 Angstroms, such as about 25 Angstroms. However, any suitable thickness may be utilized.

After the removal of the first photomask layer 114 and any subsequent etching of the first gap-filling material 120, the first gap-filling material 120 will have a sidewall which intersects the mask layer 112 at a second angle 126B. In an embodiment the second angle 126B is between about 75 degrees and about 90 degrees, such as about 85 degrees. However, any suitable angle may be utilized.

Figure 13A:
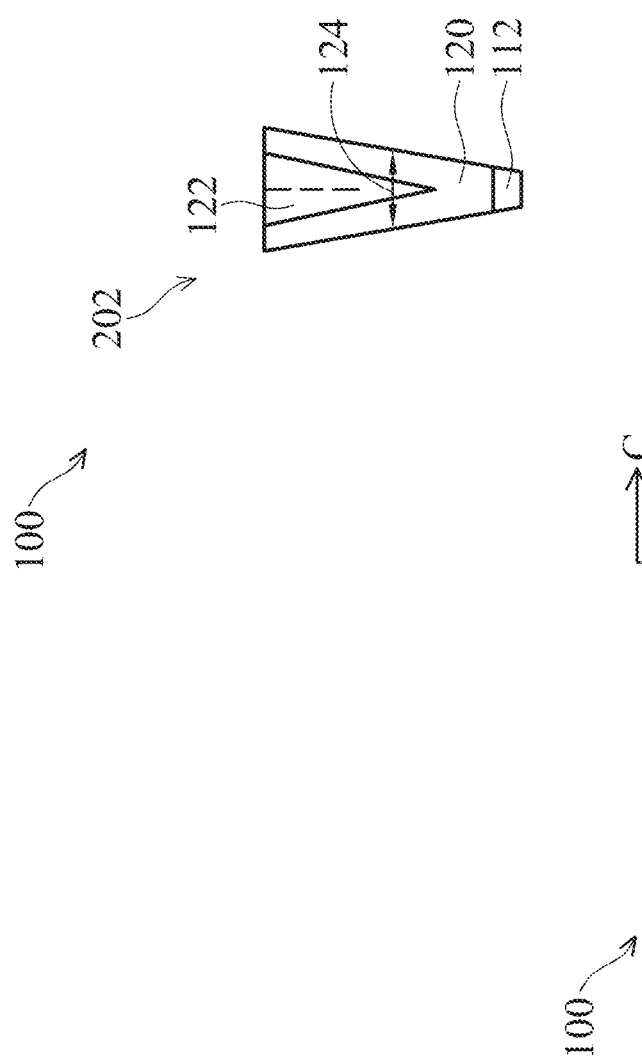
Figure 13B:
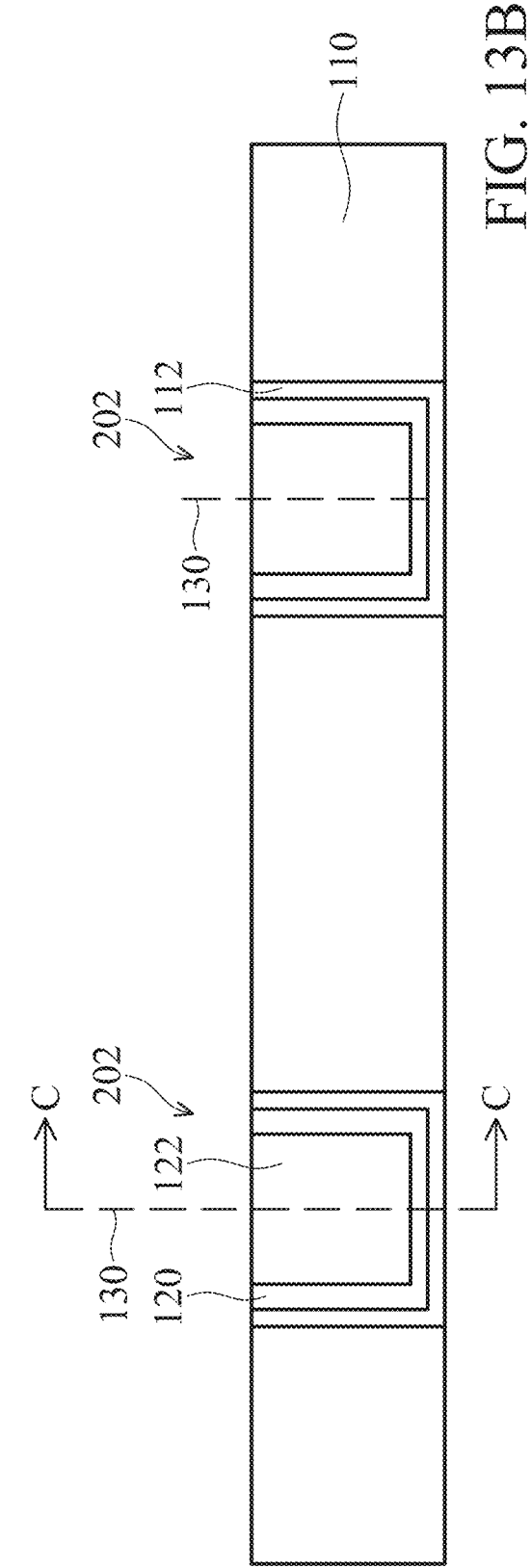
Figure 13C:
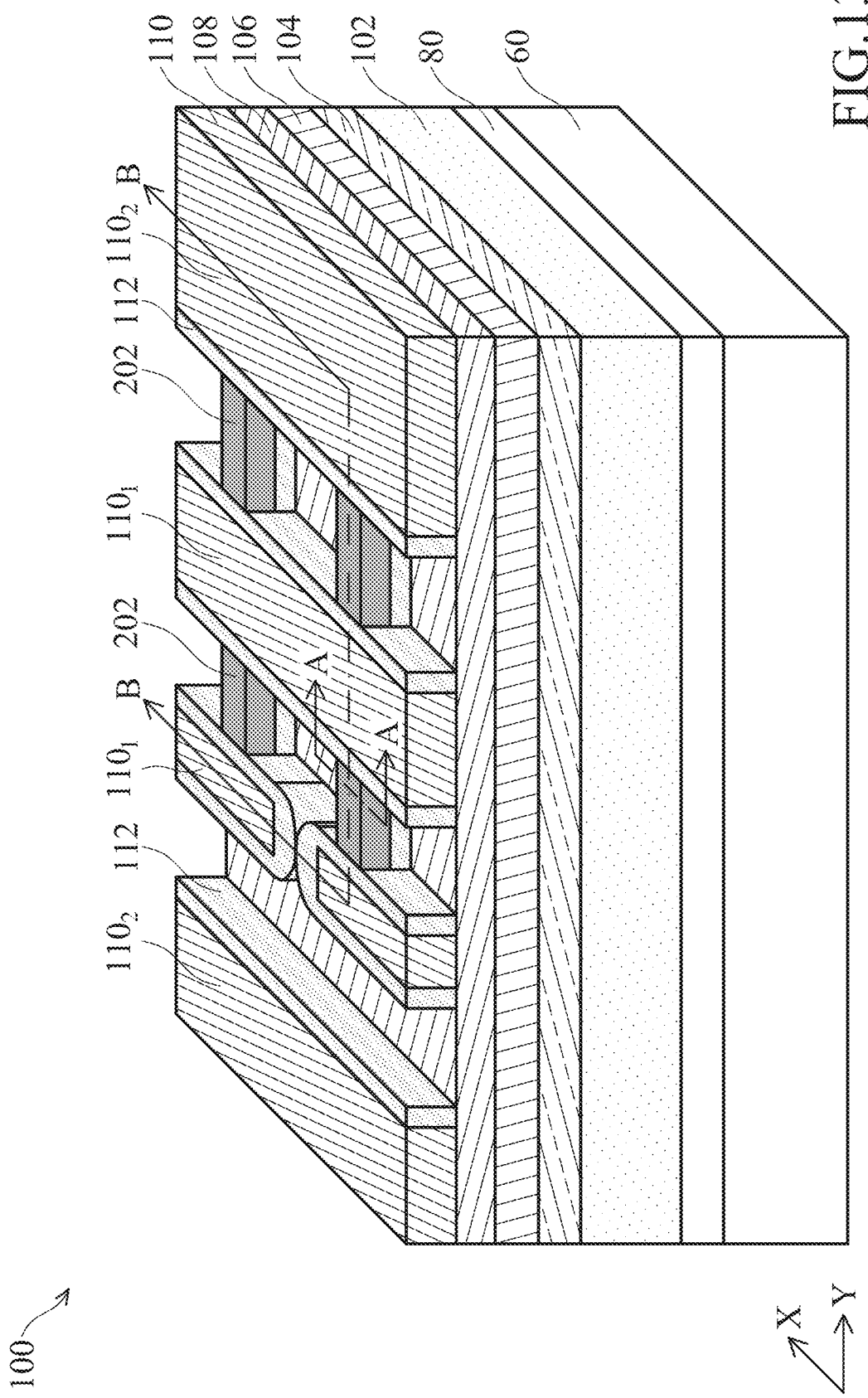

FIGS. 13A-13C illustrate a patterning of the mask layer 112 using both the first gap-filling material 120 and the second gap-filling material 122 as a mask to form the hard mask feature 202 (comprising each of the first gap-filling material 120, the second gap-filling material 122, and the mask layer 112), with FIG. 13A illustrating a cross-sectional view of a portion of the semiconductor structure 100 along line A-A from FIG. 13C while FIG. 13B illustrates a cross-sectional view of a portion of the semiconductor structure 100 along line B-B from FIG. 13C and FIG. 13A illustrating the structure of FIG. 13B along line C-C in FIG. 13B. In an embodiment the mask layer 112 may be patterned using one or more etching processes, such as an anisotropic etching process using an etchant such as $C_xF_y$, $C_xH_yF_z$, or $C_xH_yCl_z$ based gas. However, any suitable etching process may be utilized.

By first filling the openings 118 (seen FIGS. 9A-9B) and then removing the first photomask layer 114, the hard mask feature 202 of this embodiment (which includes the first gap-filling material 120) can be formed with the high aspect ratio of the opening 118. Additionally, by reducing the thickness of the material of the first gap-filling material 120, the overall thickness of the hard mask feature 202 can be controlled. In an embodiment the hard mask feature 202 can therefore have similar dimensions to the embodiment of the hard mask feature 202 described above with respect to FIG. 8A. As such, the hard mask feature 202 can be formed with a middle critical dimension 124 (MCD—e.g., the width of the hard mask feature 202 at one-half of the height of the hard mask feature 202) of about 30 nm and a typical height of about 50 nm. However, the MCD can range from between about 10 nm to about 30 nm and the height of the hard mask feature 202 can range between about 20 nm and 60 nm. Any suitable dimensions may be utilized.

FIG. 13B illustrates another view of the etching of the mask layer 112 to form the hard mask feature 202 of this embodiment including the first gap-filling material 120. Additionally, as can be seen more clearly in FIG. 13B, during the etch of the mask layer 112, the selectivity between the mask layer 112, the first gap-filling material 120, and the second gap-filling material 122 may not be high enough, and the etching process may simultaneously also etch both the first gap-filling material 120 and the second gap-filling material 122 at a reduced rate, thereby reducing the height of both the first gap-filling material 120 and the second gap-filling material 122.

FIG. 13C illustrates the structures of FIGS. 13A and 13B over the first dielectric layer 102, the second dielectric layer 104, the third dielectric layer 106, and the fourth dielectric layer 108, previously described. As can be seen, the hard mask features 202 (located between portions of the patterned layer 110 and in this embodiment comprising each of the first gap-filling material 120, the second gap-filling material 122 and the patterned portions of mask layer 112) are fully formed. Additionally, portions of the mask layer 112 remain along sidewalls of the patterned layer 110.

FIG. 13C additionally illustrates that at this point in the process top surfaces of the patterned layer 110 are exposed. If desired, certain portions of the patterned layer 110 may be identified as removable portions $110_1$ for removal so that the removable portions $110_1$ are not available for use as a mask in subsequent etching processes (described further below with respect to FIG. 14). Additionally, other portions of the patterned layer 110 may be identified as remaining portions 110₂ so that the remaining portions 110₂ remain and are available for use as a mask in subsequent etching processes.

Figure 14:
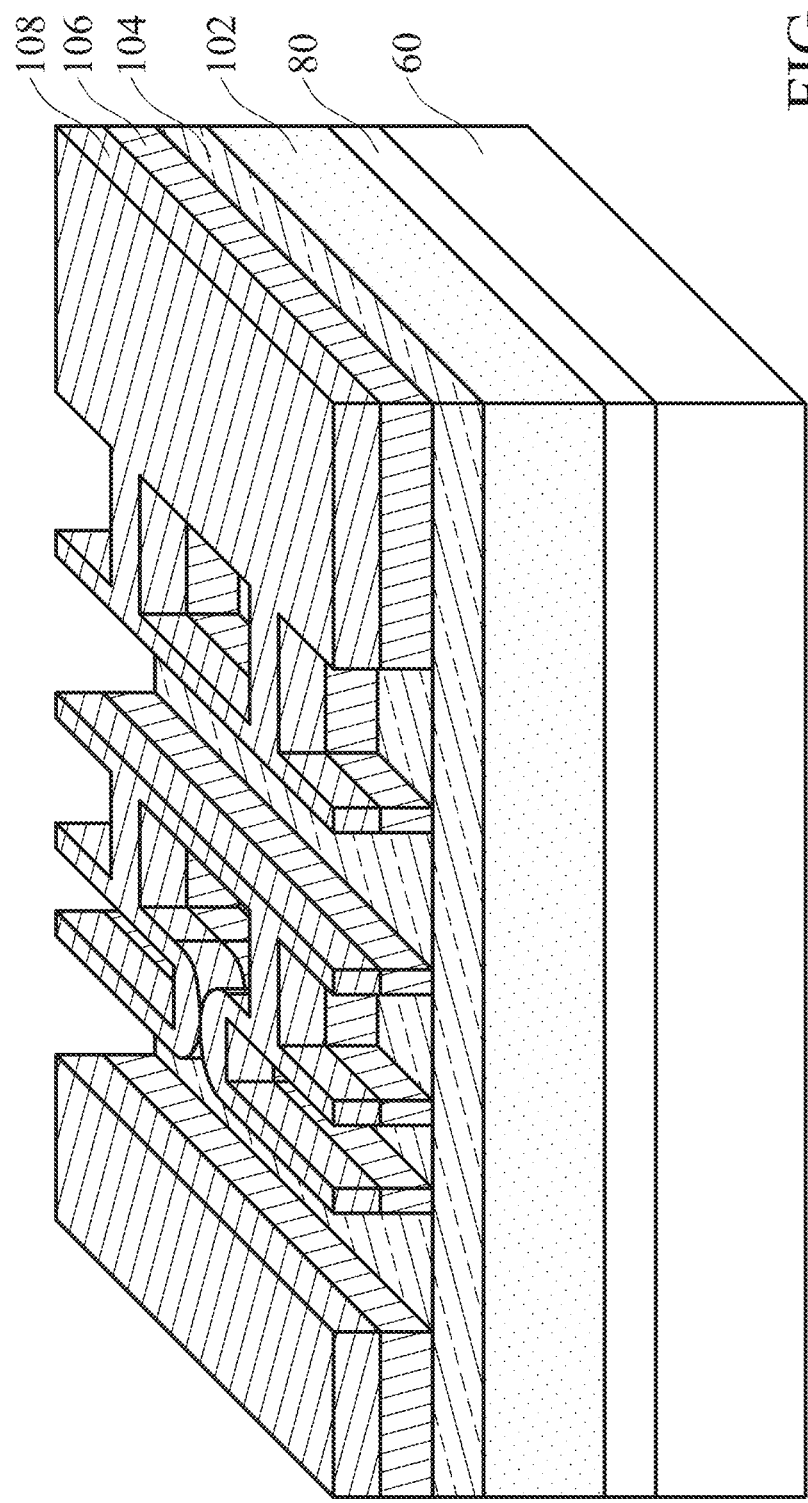
FIGS. 14-16 illustrate perspective views of the hard mask at various final stages of fabrication, in accordance with an embodiment.

Looking next at FIG. 14, the removable portions 110₁ of the patterned layer 110 are removed. In an embodiment the removable portions 110₁ are removed by initially placing and patterning a photoresist (not separately illustrated in FIG. 14) so that the photoresist covers and protects the remaining portions 110₂ while exposing the removable portions 110₁. Once the remaining portions 110 are protected, the removable portions 110₁ are then removed using one or more etching processes, such as wet etching processes or dry etching processes, before the photoresist is removed using, for example, an ashing process.

FIG. 14 also illustrates that, once the removable portions 110₁ of the patterned layer 110 have been removed, the remaining portions 110₂, the hard mask feature 202 (formed through either process as described with respect to FIGS. 4A-8C or the process as described with respect to FIGS. 9A-13B), and the mask layer 112 along the sidewalls are utilized to pattern the fourth dielectric layer 108 and the third dielectric layer 106. In an embodiment the pattern may be transferred using an anisotropic etching process such as a dry etching process. However, any suitable etching process may be utilized.

Once the pattern of the hard mask feature 202, the remaining portions 110₂ of the patterned layer 110, and the mask layer 112 along the sidewalls has been transferred, the hard mask feature 202, the remaining portions 110₂ of the patterned layer 110, and the mask layer 112 may be removed. In an embodiment one or more etching processes, such as one or more wet etches or dry etches, may be utilized to remove the hard mask feature 202 and the remaining portions 110₂ of the patterned layer 110. However, any suitable removal process may be utilized.

Figure 15:
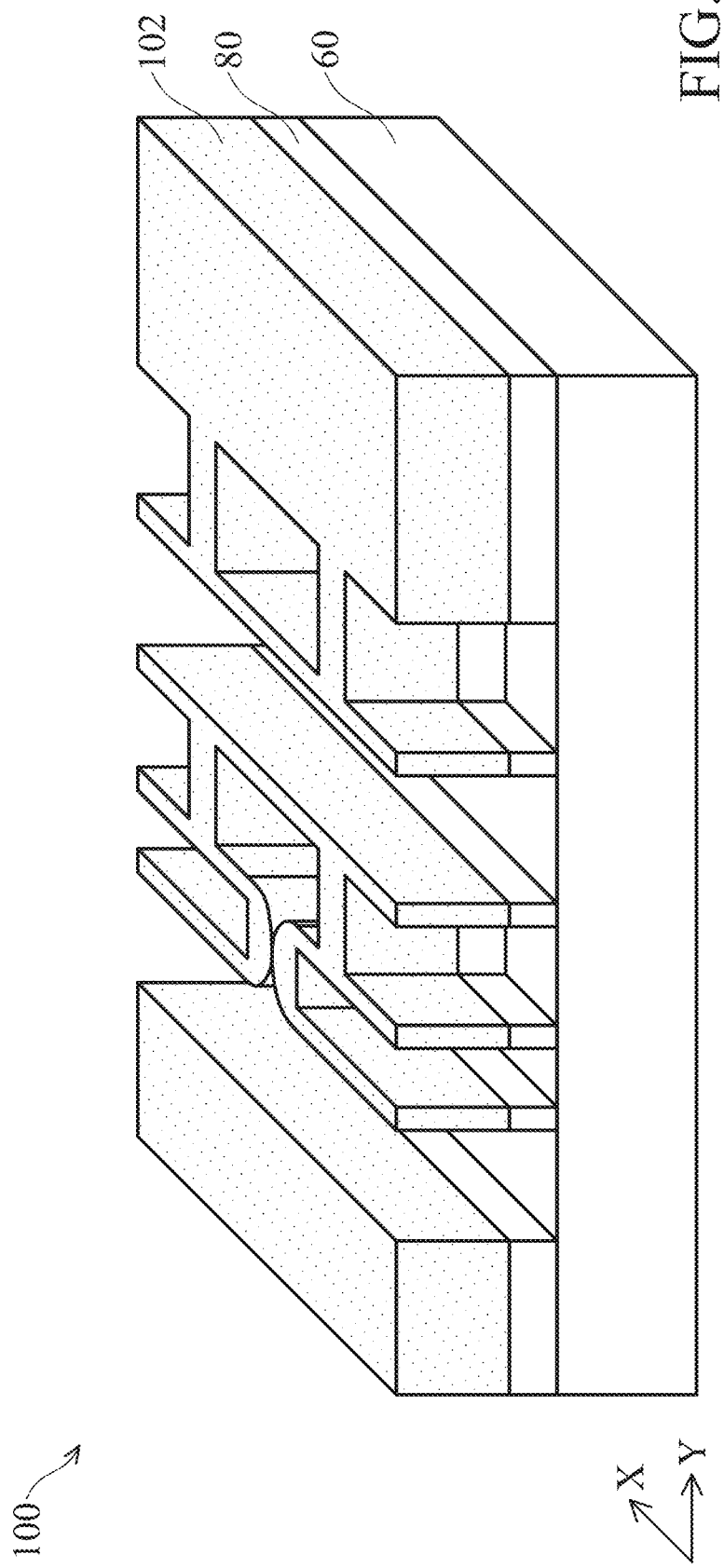

FIG. 15 illustrates a transferal of the pattern from the fourth dielectric layer 108 and the third dielectric layer 106 to the second dielectric layer 104, the first dielectric layer 102, and, eventually, to the layer to be patterned 80 above the substrate 60. In an embodiment the pattern may be transferred using one or more anisotropic etching processes such as dry etching processes. However, any suitable etching process or combination of etching processes may be utilized.

Additionally, once the pattern has been transferred, and the layer to be patterned 80 has been patterned, some of the overlying structures may be removed. In an embodiment the fourth dielectric layer 108, the third dielectric layer 106, and the second dielectric layer 104 may each be removed to expose the top surface of the first dielectric layer 102. In an embodiment the fourth dielectric layer 108, the third dielectric layer 106, and the second dielectric layer 104 may be removed using one or more etching processes, such as a series of wet etching processes or dry etching processes. However, any suitable combination of etching processes may be utilized.

Figure 16:
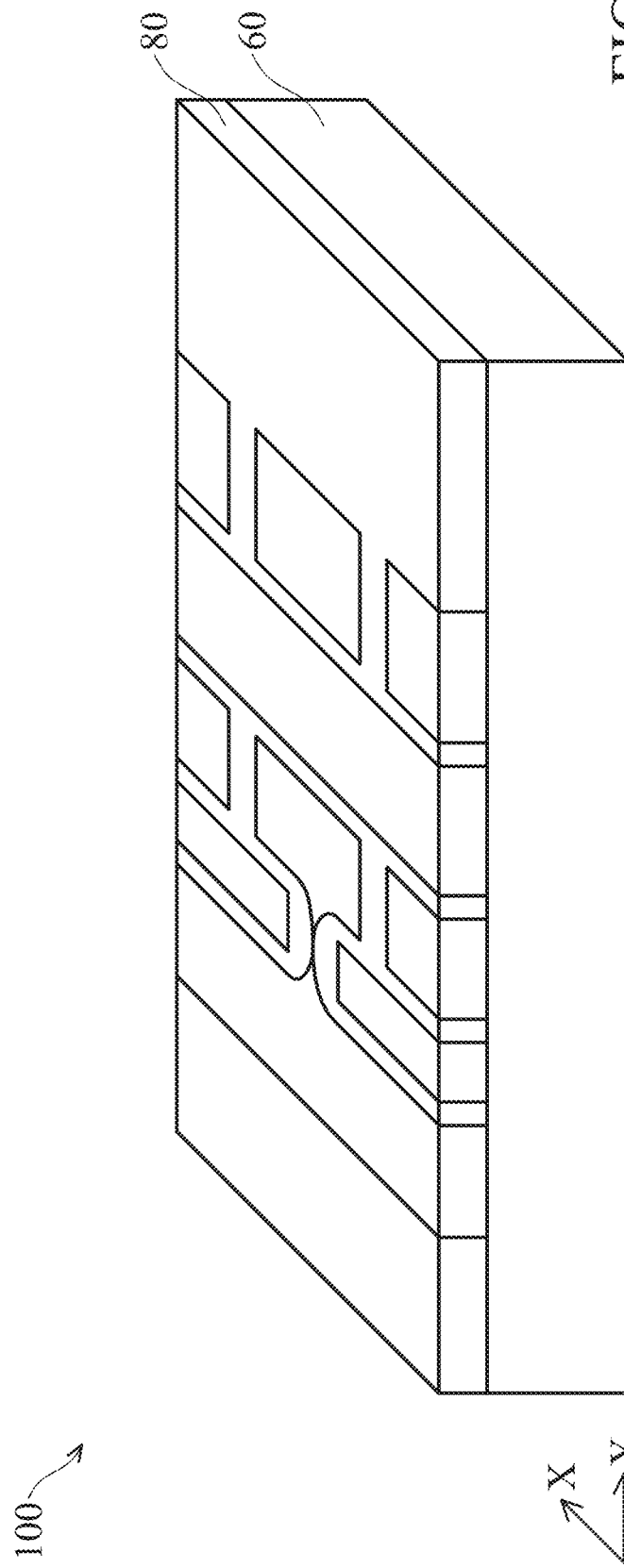

FIG. 16 shows that, once the layer to be patterned 80 has been patterned, additional processing may be performed. In an embodiment in which the layer to be patterned 80 is a dielectric layer to form a metallization layer, a conductive material 128 may be placed in the pattern of the layer to be patterned 80. In an embodiment the conductive material 128 may be a material such as copper, tungsten, aluminum, combinations of these, or the like, that is deposited using a deposition process such as electroplating, electroless plating, chemical vapor deposition, physical vapor deposition, atomic layer deposition, combinations of these, or the like. However, any suitable material and method of manufacture may be utilized.

The conductive material 128 may be deposited to fill and/or overfill the pattern of the layer to be patterned 80 and the first dielectric layer 102. Once overfilled, a planarization process, such as a chemical mechanical polishing process, may be performed to remove excess portions of the conductive material 128 from outside of the pattern and to planarize the conductive material 128 to the layer to be patterned 80, thereby also removing the first dielectric layer 102. However, any suitable planarization process may be utilized.

Figure 17:
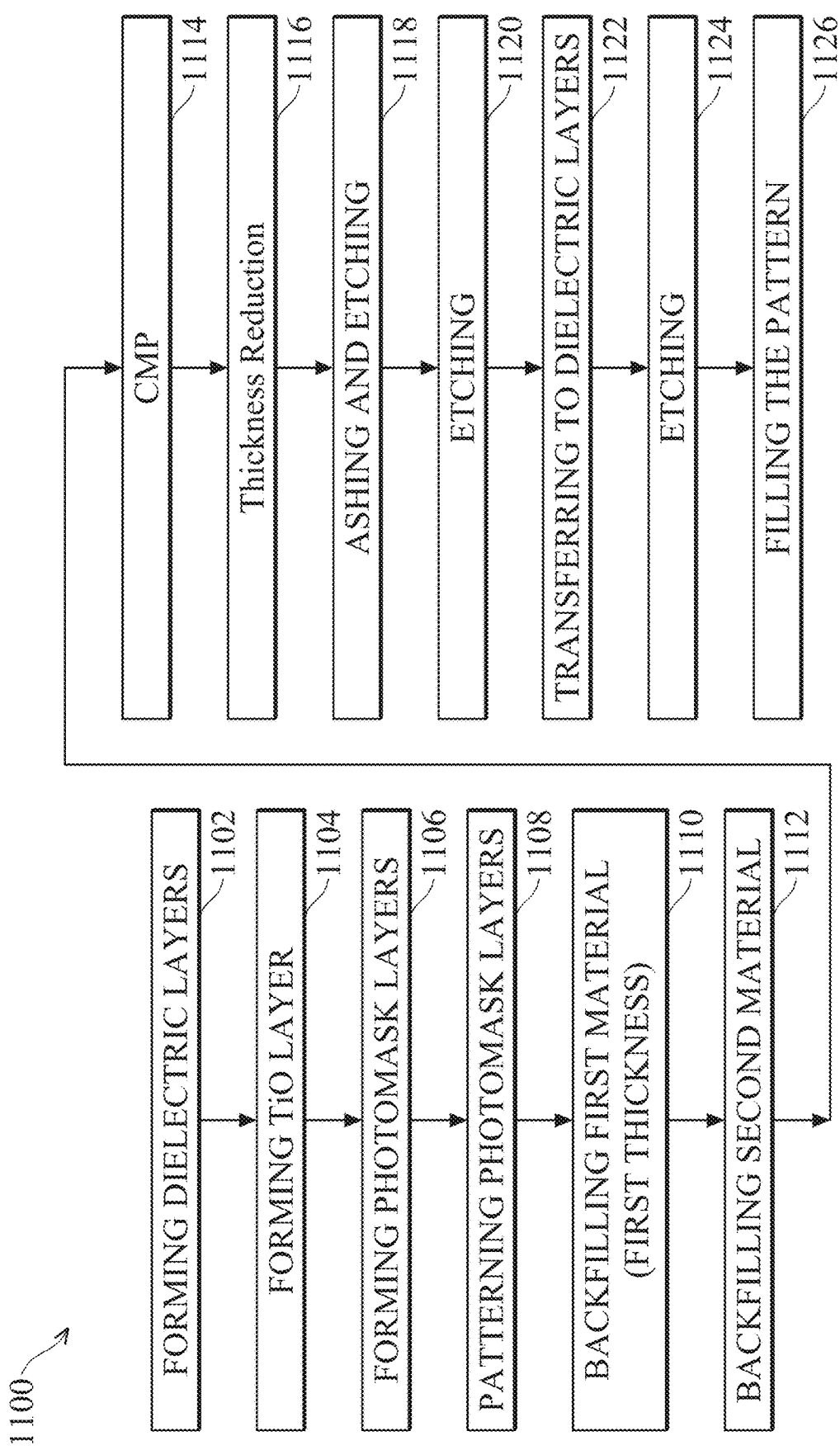
FIGS. 17-18 illustrate flow charts of methods of fabricating a semiconductor device, in accordance with embodiments.

FIG. 17 shows a flow chart 1100 of an embodiment method using a single layer gap-filling material to form a masking feature. In an embodiment the method comprises a first step 1102 for forming the first dielectric layer 102, the second dielectric layer 104, the third dielectric layer 106, and the fourth dielectric layer 108 over the layer to be patterned 80 as is shown in FIG. 1, a second step 1104 for forming the mask layer 112 as is shown in FIG. 2, a third step 1106 for forming the first photomask layer 114 and the second photomask layer 116 as is shown in FIG. 3, a fourth step 1108 for patterning the photomask layers as is also shown in FIG. 3, a fifth step 1110 for backfilling openings in the photomask layers with a first gap-filling material 120 at a first thickness as is shown in FIG. 4A, a sixth step 1112 for backfilling openings in the photomask layers with a second gap-filling material 122 as is shown in FIG. 4A, a seventh step 1114 for providing a CMP operation or etching step to planarize the surface of the mask layer as is shown in FIG. 5A, an eighth step 1116 for reducing a thickness of the first gap-filling material 120 and the second gap-filling material 122 as is shown in FIG. 6A, a ninth step 1118 for removing the first photomask layer 114 as well as the first gap-filling material 120 as is shown in FIG. 7A, a tenth step 1120 for etching away a top portion of the mask layer 112 as is shown in FIG. 8A, an eleventh step 1122 for transferring the resultant pattern to underlying structures as is shown in FIG. 14, and a twelfth step 1124 to transfer the pattern to the layer to be patterned 80, and a thirteenth step 1126 to fill the pattern in the layer to be patterned 80 with, e.g., a conductive material.

Processing steps can be removed or additional processing steps added to flow chart 1100 of FIG. 17, in embodiments. The order of the steps shown in flow chart 1100 can also be reordered in embodiments.

Figure 18:
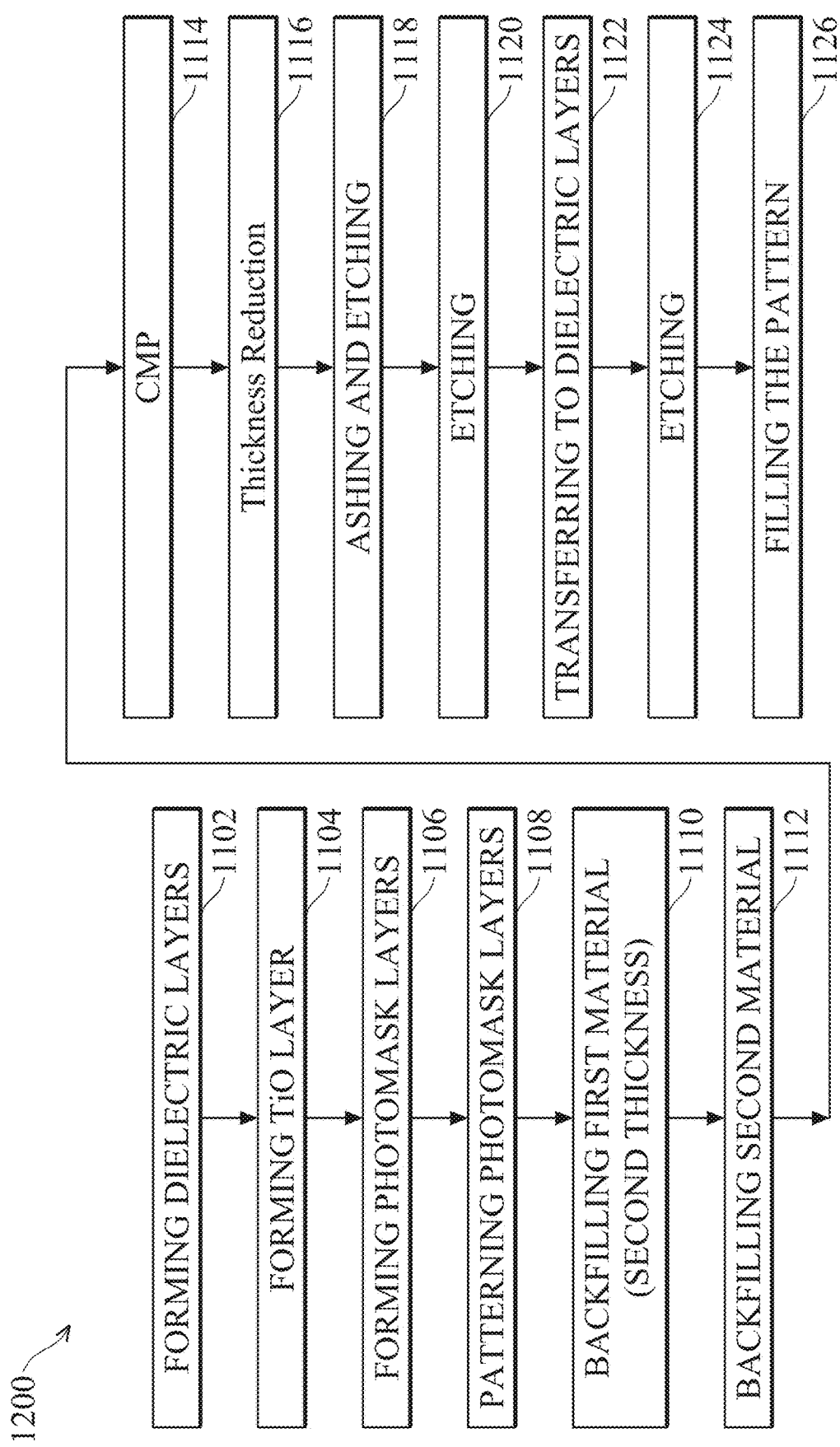

FIG. 18 shows a flow chart 1200 of an embodiment method using both the first gap-filling material 120 and the second gap-filling material 122. In an embodiment this method includes a first step 1102 for forming the first dielectric layer 102, the second dielectric layer 104, the third dielectric layer 106, and the fourth dielectric layer 108 over the layer to be patterned 80 as is shown in FIG. 1, a second step 1104 for forming the mask layer 112 over the dielectric layers as is shown in FIG. 2, a third step 1106 for forming the first photomask layer 114 and the second photomask layer 116 as is shown in FIG. 3, a fourth step 1108 for patterning the photomask layers as is also shown in FIG. 3, a fifth step 1210 for backfilling openings with a first gap-filling material 120 at a second thickness as is shown in FIG. 9A, a sixth step 1212 for backfilling openings in the photomask layers with a second gap-filling material 122 as is also shown in FIG. 9A, a seventh step 1114 for providing a CMP operation as is shown in FIG. 10A, an eighth step 1116 for reducing a thickness of the first gap-filling material 120 and the second gap-filling material 122 as is shown in FIG.

11A, a ninth step 1118 for ashing away the first photomask layer 114 and reducing a thickness of the first gap-filling material 120 as is shown in FIG. 12A, a tenth step 1120 for etching away a top portion of the mask layer 112 as is shown in FIG. 13A, an eleventh step 1122 for transferring the resultant pattern to the third dielectric layer 106 and the fourth dielectric layer 108 as is shown in FIG. 14, and a twelfth step 1124 for transferring the pattern to the layer to be patterned as is shown in FIG. 15, and a thirteenth step 1126 to fill the pattern in the layer to be patterned 80 with, e.g., a conductive material.

Processing steps can be removed or additional processing steps added to flow chart 1200 of FIG. 18, in embodiments. The order of the steps shown in flow chart 1200 can also be reordered in embodiments.

By forming the hard mask features 202 as described herein, smaller and smaller features may be achieved in the manufacturing process of semiconductor devices. For example, in embodiments in which the embodiments are utilized to form conductive lines in a metallization layer, end-to-end distances between lines (e.g., the cut metal distance), can be reduced without defects, thereby increasing the overall process window of the manufacturing process.

Additionally, in other embodiments, the advanced lithography process, method, and materials described above can be used in many other applications, including in the formation of fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

According to an embodiment, a method for manufacturing an integrated circuit includes: forming an opening within a mask over a hard mask material; depositing a first gap-filling material along sidewalls of the opening; depositing a second gap-filling material within the opening, the second gap-filling material being different from the first gap-filling material, the second gap-filling material comprising a metal oxide or a metal nitride; removing the mask; etching the first gap-filling material; and patterning the hard mask material using the second gap-filling material as a mask. In an embodiment the etching the first gap-filling material fully removes the first gap-filling material. In an embodiment the etching the first gap-filling material reduces a thickness of the first gap-filling material. In an embodiment the depositing the first gap-filling material covers the hard mask material exposed by the opening. In an embodiment the depositing the first gap-filling material is performed at least in part with an atomic layer deposition process. In an embodiment the depositing the first gap-filling material does not fully cover the hard mask material exposed by the opening. In an embodiment the hard mask material comprises titanium oxide.

According to another embodiment a method for manufacturing an integrated circuit includes: forming a plurality of dielectric layers over a substrate; forming a photomask layer on the plurality of dielectric layers; patterning the photomask layer to form a gap therethrough; partially gap-filling the gap with a first material; gap-filling the gap with a second material different from the first material, the second material comprising a metal oxide or a metal nitride; removing the photomask layer and at least a portion of the first material to form a masking structure comprising the second material; transferring a pattern formed by the masking structure to the plurality of dielectric layers and removing the masking structure; and transferring a pattern formed by the plurality of dielectric layers to the substrate. In an embodiment, the removing the photomask layer and the at least a portion of the first material removes all of the first material. In an embodiment, the removing the photomask layer and the at least a portion of the first material leaves a portion of the first material adjacent to the second material. In an embodiment, the partially gap-filling the gap with the first material comprises partially filling the gap with $SiO_x$, $SiC_xO_y$, SiC or a-C (amorphous carbon). In an embodiment, the gap-filling the gap with the second material comprises gap-filling with TiO, $Al_2O_3$, or TiN. In an embodiment, the partially gap-filling the gap with the first material is performed at least in part using an atomic layer deposition process with a first precursor comprising tris(dimethylamino)silane (3DMAS), bis(tertiary-butyl-amino) silane (BT-BAS), bis(diethylamino)silane (BDEAS), methane ($CH_4$) or ethylene ($C_2H_4$) and acetylene ($C_2H_2$). In an embodiment, the atomic layer deposition process uses a second precursor comprising $O_2$, $CO_2$, or $N_2O$. In an embodiment, the second material is formed at least in part using an atomic layer deposition process with a first precursor comprising trimethylaluminum (TMA, $Al(CH_3)_3$), diethylzinc (DEZ), tetrakis(dimethylamino)titanium (TDMAT), titanium isopropoxide (TTIP), $TiCl_4$ or tetrakis(dimethylamido)zirconium ($Zr(NMe_2)_4$) or zirconium tetrachloride ($ZrCl_4$) or tetrakis-dimethyl-amine tin (TDMASn).

According to another embodiment, a method for manufacturing an integrated circuit includes: depositing a first material into an opening within a mask layer using at least in part an atomic layer deposition process, the mask layer being over a substrate; depositing a second material into the opening using at least in part an atomic layer deposition process; removing the mask layer; etching a mask layer with the second material as a mask to form a masking structure comprising at least one of the first material and the second material; and transferring a pattern formed by the masking structure to the substrate and removing the masking structure. In an embodiment the substrate comprises a dielectric layer of a metallization layer. In an embodiment the method further includes depositing a conductive material into a pattern within the dielectric layer of the metallization layer. In an embodiment the method further includes thinning the first material after the removing the mask layer. In an embodiment the first material comprises a silicon dioxide, silicon carbide, or carbon material, and wherein the second material comprises a metal oxide or metal nitride material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
   forming a first patterned mask over a target layer, the first patterned mask having a first pattern and a second pattern;
   forming a multi-layer gap-filling material into an opening between the first pattern and the second pattern of the first patterned mask, the multi-layer gap-filling material extending above top surfaces of the first patterned mask;

removing portions of the multi-layer gap-filling material above the top surfaces of the first patterned mask; and patterning the target layer to form a patterned target layer, patterning the target layer using remaining portions of the multi-layer gap-filling material as a mask.

2. The method of claim 1, wherein the patterned target layer is conductive, further comprising:

filling the patterned target layer with a dielectric material.

3. The method of claim 1, wherein the patterned target layer is an insulating material, further comprising:

filling the patterned target layer with a conductive material.

4. The method of claim 1, wherein the remaining portions of the multi-layer gap-filling material have a V-shaped cross-section.

5. The method of claim 1, wherein forming the multi-layer gap-filling material comprises forming a first layer, wherein the first layer extends along sidewalls of the opening, wherein at least a portion of a bottom of the opening remains free of the first layer.

6. The method of claim 1, further comprising, prior to forming the multi-layer gap-filling material, forming a mask layer over a top surface and along sidewalls of the first patterned mask, wherein the multi-layer gap-filling material is formed over the mask layer.

7. The method of claim 6, further comprising removing the mask layer from an upper surface of the first patterned mask.

8. The method of claim 6, further comprising, prior to patterning the target layer, removing the first patterned mask.

9. The method of claim 6, further wherein patterning the target layer uses remaining portions of the mask layer as part of the mask.

10. A method for manufacturing an integrated circuit, the method comprising:

forming a first patterned layer over a target layer, the first patterned layer having a first pattern feature and a second pattern feature;

forming a first mask layer over the first patterned layer;

patterning the first mask layer to form a gap, wherein the gap extends between the first pattern feature and the second pattern feature;

forming a multi-layer gap-filling material into the gap, the multi-layer gap-filling material extending above top surfaces of the first patterned layer;

removing the first mask layer and portions of the multi-layer gap-filling material above an upper surface of the first patterned layer;

removing the first patterned layer; and patterning the target layer using remaining portions of the multi-layer gap-filling material as a mask.

11. The method of claim 10, further comprising, prior to forming the first mask layer, forming a second mask layer over the first patterned layer, wherein the first mask layer is formed over the second mask layer, wherein a portion of the second mask layer is exposed in the gap.

12. The method of claim 11, further comprising, after removing the first patterned layer, removing portions of the second mask layer from over an upper surface of the first patterned layer.

13. The method of claim 12, wherein patterning the target layer further comprises using remaining portions of the second mask layer as part of the mask.

14. The method of claim 13, wherein forming the multi-layer gap-filling material comprises forming a first gap-filling layer and a second gap-filling layer over the first gap-filling layer, further comprising:

prior to patterning the target layer, removing a first layer of the multi-layer gap-filling material.

15. The method of claim 10, wherein forming the multi-layer gap-filling material comprises forming a first gap-filling layer and a second gap-filling layer over the first gap-filling layer, further comprising:

prior to patterning the target layer, thinning a width of the first gap-filling layer.

16. A method for manufacturing an integrated circuit, the method comprising: forming a first patterned mask over a target layer, the first patterned mask having a first feature pattern and a second feature pattern;

forming a second patterned mask over the first patterned mask, the second patterned mask having an opening, the opening being between the first feature pattern and the second feature pattern of the first patterned mask;

forming a mask feature in the opening, forming the mask feature comprising:

depositing a first gap-filling material along sidewalls of the opening; and depositing a second gap-filling material over the first gap-filling material within the opening, the second gap-filling material being different from the first gap-filling material;

removing the second patterned mask;

thinning the mask feature to form a thinned mask feature; and patterning the target layer using the thinned mask feature as a first mask.

17. The method of claim 16, wherein thinning the mask feature comprises removing the first gap-filling material prior to removing the second patterned mask.

18. The method of claim 16, wherein thinning the mask feature is performed at least in part by etching the first gap-filling material after removing the second patterned mask.

19. The method of claim 16, further comprising:

prior to forming the second patterned mask, forming a mask layer along sidewalls of the first patterned mask; and after removing the second patterned mask, patterning the mask layer using the thinned mask feature as a second mask.

20. The method of claim 19, further comprising, after removing the second patterned mask, removing the first patterned mask, wherein patterning the target layer uses at least a portion of the mask layer as part of the first mask.

* * * * *